United States Patent [19]
Kadowaki et al.

[11] Patent Number: 6,097,257
[45] Date of Patent: Aug. 1, 2000

[54] CRYSTAL OSCILLATOR CIRCUIT HAVING TRANSISTOR WITH BACK GATE VOLTAGE CONTROL

[75] Inventors: Tadao Kadowaki; Yoshiki Makiuchi, both of Chino; Shinji Nakamiya, Matsumoto, all of Japan

[73] Assignee: Seiko Epson Corporation, Tokyo, Japan

[21] Appl. No.: 09/155,073

[22] PCT Filed: Jan. 22, 1998

[86] PCT No.: PCT/JP98/00240

§ 371 Date: Jan. 7, 1999

§ 102(e) Date: Jan. 7, 1999

[87] PCT Pub. No.: WO98/32218

PCT Pub. Date: Jul. 23, 1998

[30]  Foreign Application Priority Data

Jan. 22, 1997 [JP] Japan .................................. 9-23276
Jan. 27, 1997 [JP] Japan .................................. 9-27280
Mar. 4, 1997 [JP] Japan .................................. 9-65501

[51] Int. Cl.[7] .................................................. H03B 5/36
[52] U.S. Cl. ................................... 331/116 FE; 331/158
[58] Field of Search .................... 331/116 FE, 116 R, 331/158

[56] References Cited

U.S. PATENT DOCUMENTS 4,376,918  3/1983  Masuda et al. ........................ 331/158

FOREIGN PATENT DOCUMENTS

| 0724331A1 | 7/1996 | European Pat. Off. . |
| 53-19065 | 2/1978 | Japan . |
| 54-37452 | 3/1979 | Japan . |
| 54-37670 | 3/1979 | Japan . |
| 01094704 | 4/1989 | Japan . |
| 5-218740 | 8/1993 | Japan . |
| 8-204450 | 8/1996 | Japan . |

Primary Examiner—Siegfried H. Grimm
Attorney, Agent, or Firm—Oliff & Berridge, PLC

[57]  ABSTRACT

An oscillation circuit comprising a control circuit that utilizes the body effect of a substrate bias to control the source potential of a MOSFET that configures a signal inversion amplifier. This control circuit controls the threshold voltage of this MOSFET to be low when power is first applied to the oscillation circuit, and controls the threshold voltage of the MOSFET to be high after the oscillation of the oscillation circuit has stabilized. This makes it possible to ensure that the oscillation circuit oscillates stably and at a low power consumption.

36 Claims, 22 Drawing Sheets

CRYSTAL OSCILLATOR CIRCUIT HAVING TRANSISTOR WITH BACK GATE VOLTAGE CONTROL

TECHNICAL FIELD

This invention relates to an oscillation circuit, an electronic circuit, a semiconductor device, electronic equipment, and a timepiece.

BACKGROUND ART

Oscillation circuits that use crystal oscillators are widely used in the art in applications such as timepieces and portable telephones and computer terminals. In such portable devices, it is necessary to design them to reduce power consumption and thus have longer battery lives.

From the viewpoint of reducing power consumption, the present inventors have analyzed the power consumptions of semiconductor devices that are installed in the electronic circuitry used in portable electronic equipment, particularly wristwatches. The results of this analysis show that the power consumption of the oscillation circuit parts of such a semiconductor device is far larger than that of the other circuits. In other words, the present inventors have discovered that reducing the power consumption of the oscillation circuit parts used in portable electronic equipment is effective for increasing battery life.

DISCLOSURE OF THE INVENTION

An objective of this invention is to provide an oscillation circuit, electronic circuit, semiconductor device, electronic equipment, and timepiece that can be driven at low power consumptions.

Another objective of this invention is to provide an oscillation circuit, electronic circuit, semiconductor device, electronic equipment, and timepiece wherein the effects of variations in the threshold voltages of transistors comprised within the signal inversion amplifiers of the oscillation circuit can be reduced, to enable stabilized oscillation.

In order to achieve the above objectives, the oscillation circuit of this invention comprises, a signal inversion amplifier;

a feedback circuit having a crystal oscillator, for inverting the phase of an output signal of the signal inversion amplifier and feeding this inverted signal back as an input to the signal amplifier; and a control circuit for controlling a back gate voltage between a back gate and a source of a transistor configuring the signal inversion amplifier.

This aspect of the invention makes it possible to utilize the body effect of a substrate bias actively, to ensure that the source potential of the transistor comprised within the signal inversion amplifier differs from the back gate potential thereof. This makes it possible to control the threshold voltage of the transistor and reduce the power consumption of the oscillation circuit when it is operating.

It is preferably that field effect transistors are used as transistors configuring the signal inversion amplifier.

Transistors configuring the signal inversion amplifier may comprise a first transistor and a second transistor; and the control circuit may employ a configuration that controls the back gate voltage of the second transistor.

In addition, it is preferable that a depletion type of field effect-transistor is used as these transistors.

When the back gate of the second transistor is set to a predetermined potential, the control circuit may comprise:

a rectifier element circuit connected to the source of the second transistor;

a switching element that forms a bypass circuit for the rectifier element circuit; and a switching circuit for selectively switching a back gate voltage of the second transistor over at least two stages, by on/off control of the switching element.

When the source of the second transistor is set to a predetermined potential, the control circuit may comprise;

a rectifier element circuit connected to a back gate of the second transistor;

a switching element that forms a bypass circuit for the rectifier element circuit; and a switching circuit for selectively switching a back gate voltage of the second transistor over at least two stages, by outputting on/off control signals of the switching element.

This configuration makes it possible to select the threshold voltage of the second transistor in a stepwise manner by on/off control of the switching element, so that the oscillation circuit can be driven with a reduced power consumption.

A power supply line of the signal inversion amplifier may be connected to a first potential side and a second potential side of a potential that differs from the first potential; and the signal inversion amplifier may generate an oscillation signal having a potential difference that is between the first potential and the second potential.

This makes it possible for the signal inversion amplifier to oscillate stably with sufficient signal amplification.

The potential difference between the first potential and the second potential may be greater than the absolute value of an oscillation-stopped voltage of the signal inversion amplifier.

The rectifier element circuit may comprise a plurality of rectifier elements connected in the forward direction in series; and the switching element may form a bypass circuit for at least one rectifier element among the plurality of rectifier elements.

In such a case, it is preferable that a plurality of switching elements is provided, to form bypass circuits for a plurality of rectifier elements.

This configuration makes it possible to select several stages of voltage drop by rectifier elements and thus provide multi-stage control over the back gate voltage of the second transistor, by combinations of on/off control of the switching elements. It is therefore possible to select the threshold voltage of the second transistor over several stages and thus drive the oscillation circuit more efficiently at a low power consumption.

A component such as a diode could be used as each of these rectifier elements.

The control circuit may control a back gate voltage of the second transistor to have different values during a first time period for activating the oscillation circuit and a second time period during which the oscillation circuit oscillates stably.

The switching circuit may comprise:

operating time period detection means for detecting a period from power-on until a given time has elapsed as a first time period for activating the oscillation circuit, and after the given time period has elapsed, for detecting a second time period during which the oscillation circuit oscillates stably; and means for controlling the switching of the back gate voltage over at least two stages in such a manner that the absolute value of the threshold voltage of the second transistor is small during the first time period and large during the second time period.

This configuration makes it possible to activate the oscillation circuit reliably and also reduce the power consumption of the oscillation circuit when it is oscillating stably.

In particular, the adoption of such a configuration makes it possible to maintain a stabilized oscillation state, even when the power charged into the crystal oscillator during each charging/discharging cycle is not completely discharged in a state in which the crystal oscillation circuit is oscillating stably. This makes it possible to reduce the power consumption of the entire circuit efficiently.

A short-circuit current flowing through the signal inversion amplifier may have a value within a range that satisfies a first condition such that it is greater than the ON-state current of a transistor configuring the signal inversion amplifier, whereby the back gate voltage is selected, and a potential difference between the first potential and the second potential may be at a minimum voltage.

This makes it possible for the oscillation circuit to provide a more stable oscillation.

An electronic circuit in accordance with this invention comprises;

the previously described oscillation circuit; and a constant-voltage generation circuit for supplying to the oscillation circuit the second potential with respect to the first potential;

wherein the constant-voltage generation circuit comprises:

a constant-current power source for supplying a constant current, wherein one end thereof is connected to the first potential side;

a constant-voltage control transistor formed under the same fabrication conditions as those of the second transistor and also provided in a constant-current path in such a manner that one end thereof is connected to the constant-current power source side and another end thereof is connected to a constant-voltage output line side, for outputting a comparison voltage for generating a constant voltage at the second potential;

an operational amplifier having one terminal to which the comparison voltage is input and another terminal to which a given reference voltage is input; and an output transistor provided in a constant-current path such that one end thereof is connected to the constant-voltage output line side, the resistance thereof being controlled by inputting an output of the operational amplifier to the gate thereof, whereby the potential of the constant-voltage output line is controlled to be a constant voltage at the second potential.

With the above configuration, it is possible to make the temperature characteristic of the constant voltage that is output from the constant-voltage generation circuit the same as the temperature characteristic of the oscillation-stopped voltage of the oscillation circuit. As a result, the oscillation circuit can oscillate stably, even when the absolute value of the constant voltage is set to a small value under a condition such that it exceeds the absolute value of the oscillation-stopped voltage. This makes it possible to reduce the absolute value of the constant voltage and reduce the power consumption of the oscillation circuit even further.

In addition, the use of the above configuration makes it possible to use the constant-voltage control transistor to compensate for variations in the threshold voltages of the transistors of the signal inversion amplifiers, which occur during the fabrication process. The yield of this semiconductor device can thereby be increased.

A semiconductor device in accordance with this invention comprises the previously described oscillation circuit or electronic circuits Electronic equipment in accordance with this invention comprises the previously described oscillation circuit, electronic circuit or semiconductor device, wherein an operating reference signal is shaped from an oscillation output of the oscillation circuit, A timepiece in accordance with this invention comprises the previously described oscillation circuit, electronic circuit, or semiconductor device, wherein a timepiece reference signal is shaped from the oscillation output of the oscillation circuit.

The electronic equipment and timepiece of this invention can be designed to have a low power consumption, while ensuring that the circuitry operates stably.

BEST MODE FOR CARRYING OUT THE INVENTION

Suitable embodiments of this invention will be described below with reference to the accompanying drawings.

Analysis of Prior-Art Techniques

Before dealing with actual embodiments of this invention, the description first concerns the results of analysis performed by the present inventors into portable electronic equipment, particularly the power consumption of electronic circuits used in wristwatches, from the viewpoint of reducing this power consumption.

This analysis has determined that, of the electronic circuits formed on a printed board, the portions relating to the oscillation circuit consume a far larger proportion of power than the other circuits. In other words, the inventors have discovered that reducing the power consumption of the oscillation circuit portions of electronic circuits used in portable electronic equipment will be effective in increasing the lifetimes of batteries used in such equipment.

Figure 14:
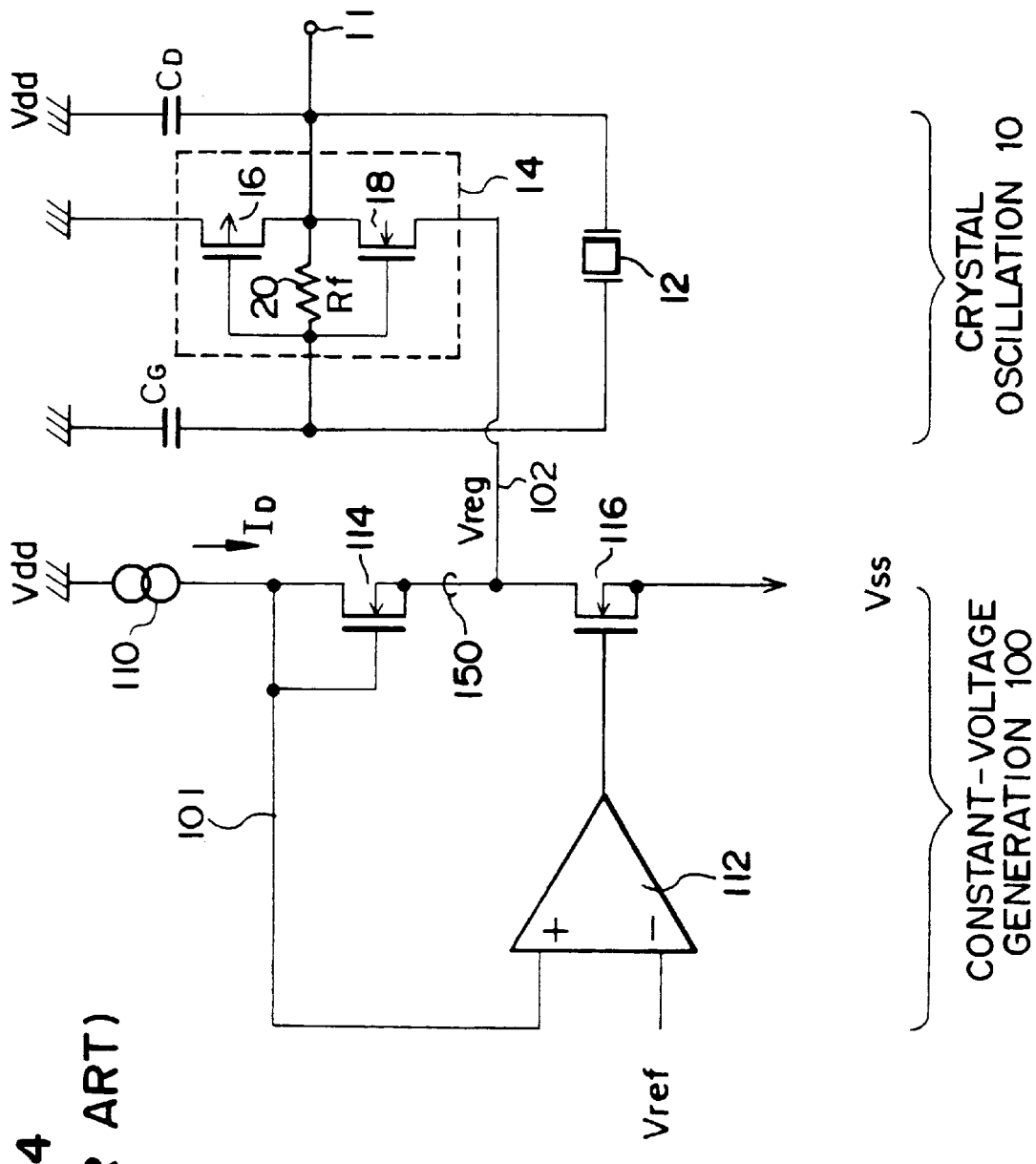
FIG. 14 is a schematic view of a prior-art crystal oscillation circuit and constant-voltage generation circuit.

This analysis also determined that lowering the power supply voltage itself in order to reduce the power consumption has a large effect on variations in the threshold voltages of the MOSFETs comprised within the signal inversion amplifier, causing a problem in that it is highly likely that the operation of the oscillation circuit will fail, This is described in detail below Prior-Art Circuitry An example of a prior-art crystal oscillation circuit 10 and constant-voltage generation circuit 100 are shown in FIG. 14. This crystal oscillation circuit 10 comprises a signal inversion amplifier 14 and a feedback circuit. This feedback circuit comprises a crystal oscillator 12, a resistor $R_f$, and capacitors $C_o$ and $C_g$ for phase compensation, with the configuration being such that an output from the drain of the signal inversion amplifier 14 is phase-inverted by 180° and fed back to the gate of the signal inversion amplifier 14 as a gate input.

The signal inversion amplifier 14 comprises paired transistors: a p-type field effect transistor (hereinafter abbreviated to "PMOSFET") 16 and an n-type field effect transistor (hereinafter abbreviated to "NMOSFET") 18. This signal inversion amplifier 14 is connected between a first potential side and a second potential side that is at a lower voltage, and is driven by a power supply delivered by the potential difference between these two potentials. In this case, the first potential is set to a ground voltage $V_{dd}$ and the second potential is set to a negative constant voltage $V_{reg}$.

When the constant voltage $V_{reg}$ is applied to the signal inversion amplifier 14 in the crystal oscillation circuit 10 of the above configuration, the phase of the output of the signal inversion amplifier 14 is inverted through 180° and is fed back to the gate thereof. This drives the PMOSFET 16 and the NMOSFET 18 of the signal inversion amplifier 14 to turn alternately on and off, which increases the oscillation output of the crystal oscillation circuit 10 until the crystal oscillator 12 is driven to oscillate stably.

First Observation

In this crystal oscillation circuit 10, the PMOSFET 16 and the NMOSFET 18 are always driven to turn alternately on and off, even after the oscillation has stabilized. Whenever the PMOSFET 16 is driven on in this prior-art circuit, the energy charged in the crystal oscillator 12 is substantially discharged. This means that the crystal oscillator 12 has to be charged again from the start in the next charging cycle.

In other words, the stabilized oscillation state can be maintained in a state in which the crystal oscillation circuit 10 is oscillating stably, even although the power stored in the crystal oscillator 12 is not discharged completely. However, in each charging/discharging cycle of this prior-art circuit, a cycle is repeated in which the power charged into the crystal oscillator 12 is discharged and then recharged.

The present inventors have discovered that this is a major cause of increase in the power consumption of the entire circuit.

Second Observation

The present inventors have discovered that the difference in temperature characteristic between the constant voltage $V_{reg}$ supplied to the crystal oscillation circuit 10 of the prior-art circuit and the oscillation-stopped voltage $V_{sto}$ of the oscillation circuit 10 is a large factor in preventing reductions in the power consumption of the oscillation circuit 10.

In other words, if the threshold voltage of the NMOSFET 18 is assumed to be $V_{thn}$ and the threshold voltage of the PMOSFET 16 is assumed to be $V_{thp}$, the absolute value $|V_{sto}|$ of the oscillation-stopped voltage of the crystal oscillation circuit 10 of FIG. 14 can be expressed as follows;

$$|V_{sto}|=K \cdot (|V_{thp}|+V_{thn}) \quad (1)$$

where K is a constant between 0.8 and 0.9. As is clear from Equation 1, the oscillation-stopped voltage $V_{sto}$ depends on the threshold voltage $V_{thn}$ of the NMOSFET 18 and the threshold voltage $V_{thp}$ of the PMOSFET 16.

The constant-voltage generation circuit 100 comprises a constant-current power source 110, an operational amplifier 112, a constant-voltage control NMOSFET 114, and an output NMOSFET 116.

The constant-current power source 110 is provided on a constant-current path 150, of which one end is connected to a ground potential $V_{dd}$ side and the other end thereof is connected to a power source potential $V_{ss}$ side, and a predetermined constant current $I_D$ is constantly supplied to the constant-current path 150. This constant-current path 150 is connected in series to the NMOSFETs 114 and 116.

The constant-voltage control NMOSFET 114 is positioned between the constant-current power source 110 and a constant-voltage signal output line 102. The gate and drain of the constant-voltage control NMOSFET 114 are short-circuited, and a comparison voltage for generating a constant voltage is output therefrom to a signal line 101.

The comparison voltage is input to a positive (hereinafter abbreviated to "+") input terminal of the operational amplifier 112 through this signal line 101, and a predetermined reference voltage $V_{ref}$ is input to a negative (hereinafter abbreviated to "−") input terminal thereof. This operational amplifier 112 amplifies and outputs the voltage difference therebetween.

The output NMOSFET 116 is positioned between the signal output line 102 and the power supply voltage $V_{ss}$. The resistance of the NMOSFET 116 is controlled by inputting the output of the operational amplifier 112 to the gate thereof. This ensures that the potential of the signal output line 102 is fed back to control the constant voltage $V_{reg}$ that is at a second reference potential.

The constant current $I_D$ is supplied to the constant-voltage control NMOSFET 114 from the constant-current power source 110. A potential difference of $\alpha V_{thn}11$, which is dependent on the threshold voltage $V_{thn}11$ of the constant-voltage control NMOSFET 114, is therefore generated between the signal line 101 and the signal output line 102. This generates a potential difference of $\alpha(V_{ref}+V_{thn}11)$ between the signal output line 102 and the ground potential $V_{dd}$.

It can be understood therefrom that the output voltage $V_{reg}$ of the constant-voltage generation circuit 100 is affected by the reference voltage $V_{ref}$ and the threshold voltage $V_{thn}11$ of the constant-voltage control NMOSFET 114. In other words, the constant voltage $|V_{reg}|$ is proportional to the voltage $(V_{ref}+V_{thn}11)$ Therefore, the crystal oscillation circuit 10 of the prior-art configuration uses a constant voltage $V_{reg}$ that is dependent on the voltage $V_{ref}+V_{thn}11)$ as a power supply for operation:

However, there are often wide variations in the value of the threshold voltage $V_{thn}11$ of the constant-voltage control NMOSFET 114, caused during the semiconductor fabrication process that is the step of fabricating this constant-voltage generation circuit 100. In this prior-art circuit, such a variation could cause the threshold voltage $V_{thn}11$ to rise, by way of example, which would make the constant voltage $|V_{reg}|$ that is output from the line 102 also rise. For that reason, the relationship between the constant voltage $V_{reg}$ and the oscillation-stopped voltage $V_{sto}$ is always such that: $|V_{reg}|>|V_{sto}|$. This is advantageous in that the operation of the oscillation circuit 10 of the prior-art circuit is guaranteed, enabling an increase in the IC yield.

To ensure that the oscillation circuit 10 operates at a low power consumption, it is necessary to reduce the constant voltage $|V_{reg}|$ as far as possible while satisfying the condition $(|V_{reg}|>|V_{sto}|)$ that ensures oscillation. However, if the constant current $I_D$ supplied from the constant-current power source 110 is reduced in order to reduce the constant voltage $|V_{reg}|$, a problem occurs in that the thus generated constant voltage $V_{reg}$ tends to vary widely due to changes in the constant current caused by temperature variations.

This temperature characteristic is discussed in detail below.

In the constant-voltage generation circuit 100, the current $I_D$ of the constant-current power source 110 that drives the constant-voltage control NMOSFET 114 is dependent on temperature. In other words, if this constant-current power source 110 uses a depletion type PMOSFET, by way of example, the constant current $I_D$ can be expressed by the equation below. In this case, the current amplification ratio of the depletion PMOSFET of the constant-current power source is assumed to be $\beta$, the absolute value of the threshold voltage thereof is $|V_{th}|$, and the voltage between gate and source thereof is $V_{as}$.

$$I_D=(\tfrac{1}{2})\cdot\beta\cdot(V_{as}|V_{th}-|)^2 \quad (2)$$

The gate and source of this PMOSFET are short-circuited to create a constant current, so this $V_{as}$ is 0 V. If this condition is substituted into Equation 2, the following is obtained:

$$I_D=(\tfrac{1}{2})\cdot\beta\cdot(-V_{th})^2 \quad (3)$$

It can be seen from Equation 3 that the constant current $I_D$ is not dependent on the power supply voltage $V_{ss}$. However, this constant current $I_D$ is proportional to the temperature-dependent current amplification ratio $\beta$ and the square of the threshold voltage $V_{th}$. It can therefore be understood that the value of the constant current $I_D$ will vary with changes in temperature.

Figure 15:
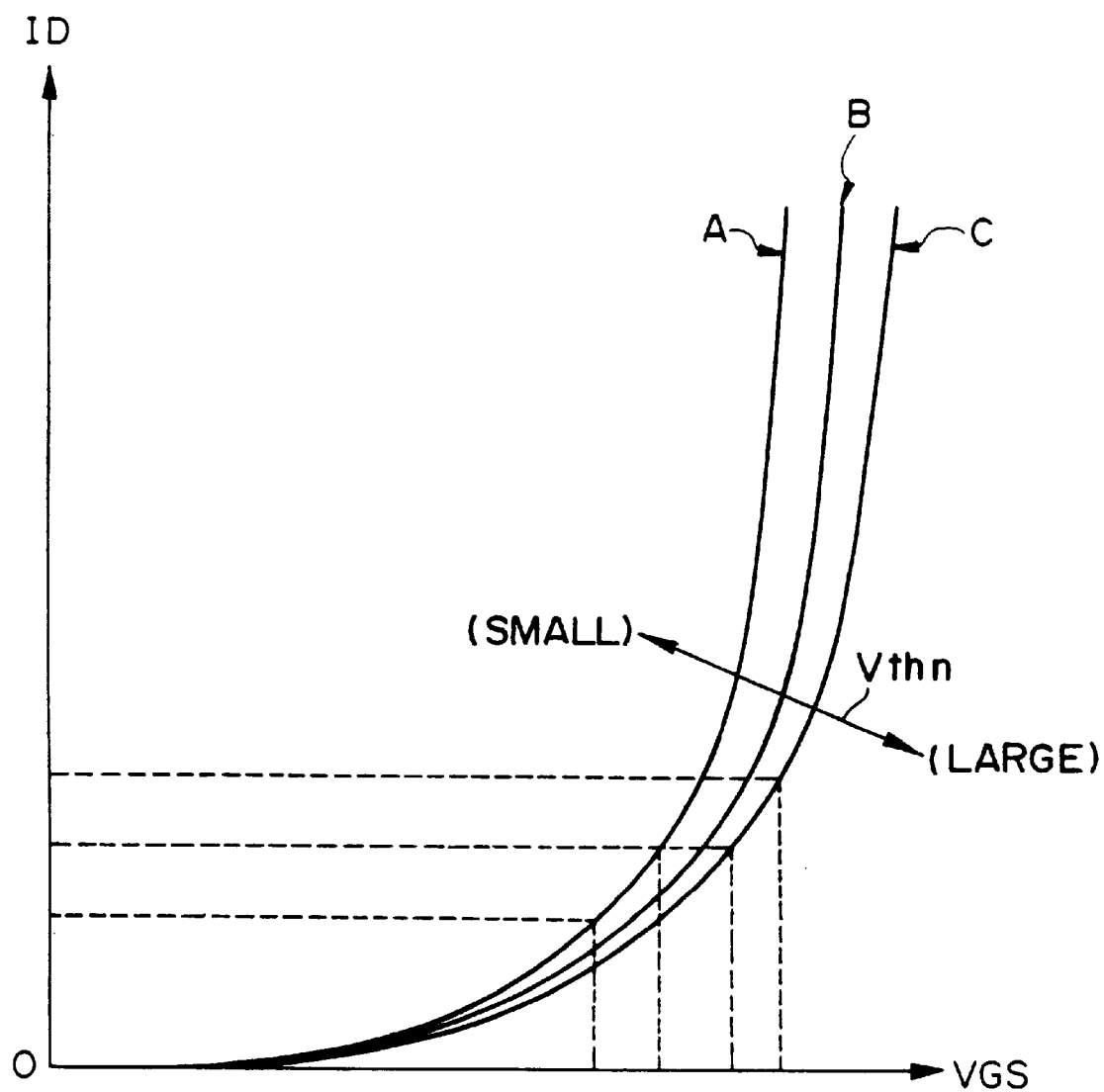
FIG. 15 is an explanatory view of the temperature characteristics of a constant voltage $|V_{reg}|$ and a oscillation-stopped voltage $|V_{sto}|$.

The temperature characteristic of the NMOSFET 114 comprised within the constant-voltage generation circuit 100 is shown in FIG. 15. In this graph, the constant current $I_D$ supplied by the constant-current power source 110 is plotted along the vertical axis and the voltage $V_{as}$ between the gate and source of the NMOSFET 114 is plotted along the horizontal axis. Three curves A to C are shown. Curve A is the characteristic when the threshold voltage $V_{thn}11$ of the NMOSFET 114 is low, curve C is that when the threshold voltage $V_{thn}11$ is high, and curve B is that when the threshold voltage $V_{thn}11$ lies between those of curves A and C. In other words, it is clear from these characteristic curves that $V_{as}$ of the constant-voltage control NMOSFET 114 is affected by changes in the constant current $I_D$ supplied by the constant-current power source 110.

Therefore, the constant voltage $V_{reg}$ is affected by the temperature changes in each of the constant current $I_D$ of the constant-current power source 110, the threshold voltage $V_{thn}11$ of the NMOSFET 114, and the reference voltage $V_{ref}$.

Since the oscillation-stopped voltage $V_{sto}$ is derived as shown in Equation 1, it is affected by temperature changes in the threshold voltage $V_{thn}$ of the NMOSFET 18 and the threshold voltage $V_{thp}$ of the PMOSFET 16.

Thus the temperature characteristic of the constant voltage $V_{reg}$ is dependent on the amount of change in the constant current $I_D$ and the amount of change in the voltage $(V_{ref}+V_{thn}11)$. In contrast thereto, the temperature characteristic of the oscillation-stopped voltage $V_{sto}$ is dependent on the amount of change in the threshold voltage $(|V_{thp}|+V_{thn})$. This makes it understandable why there is a difference between the temperature characteristics (temperature coefficients) of the constant voltage $V_{reg}$ that is output from the constant-voltage generation circuit 100 and the oscillation-stopped voltage $V_{sto}$ of the crystal oscillation circuit 10.

Figure 16:
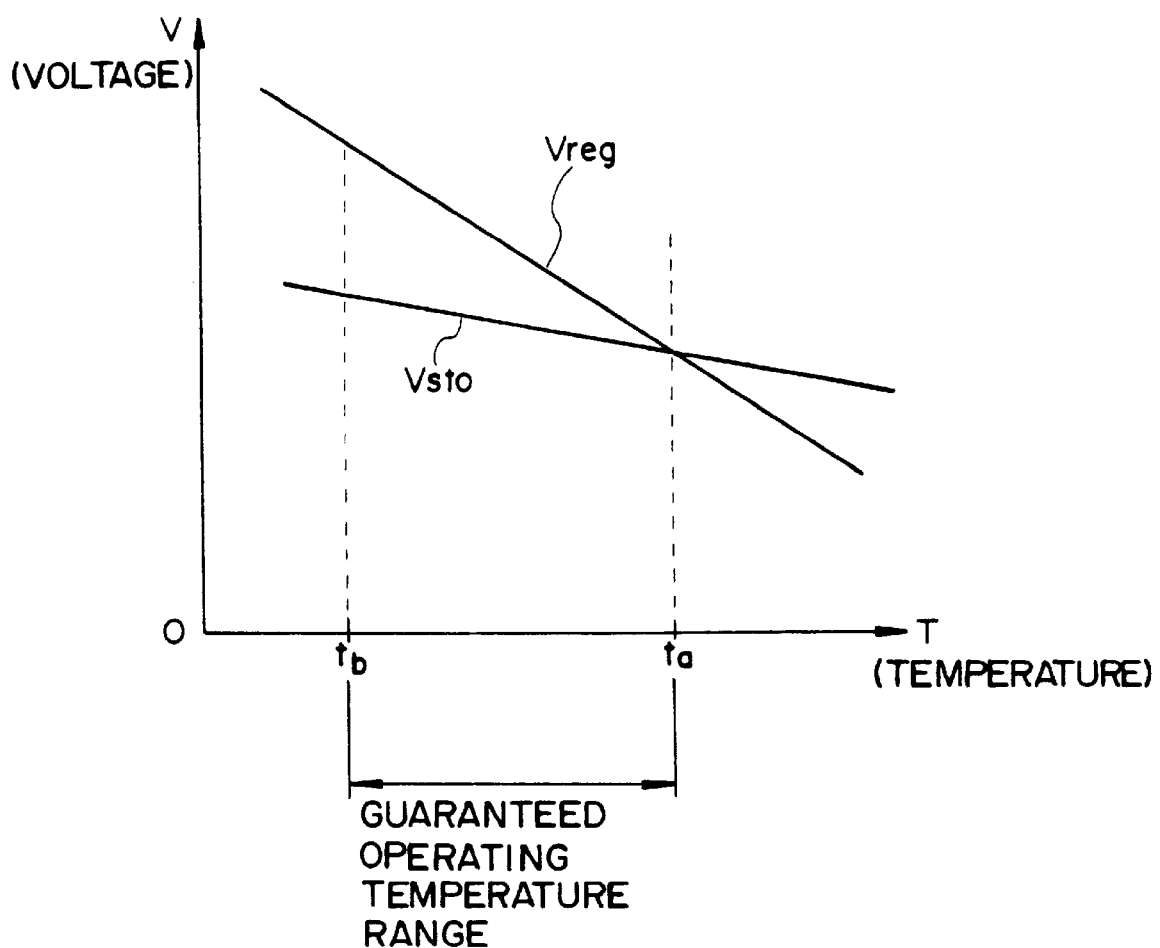
FIG. 16 shows the characteristic of an NMOSFET used in a constant-voltage generation circuit.

An example of the difference between the temperature characteristics of the constant voltage $V_{reg}$ and the oscillation-stopped voltage $V_{sto}$ is shown in FIG. 16. This graph illustrates the relationship between temperature and the constant voltage $|V_{reg}|$ and the oscillation-stopped voltage $|V_{sto}|$. In this graph, temperature T is plotted along the horizontal axis and voltage V of the constant voltage $V_{reg}$ and the oscillation-stopped voltage $V_{sto}$ is plotted along the vertical axis.

To ensure the oscillation of the crystal oscillation circuit 10, the condition $|V_{reg}|>|V_{sto}|$ must be satisfied even at a maximum temperature $t_R$ of the guaranteed operating range, shown in FIG. 16. In this case, this temperature $t_a$ is the upper temperature limit for known heat-resistance testing of wristwatches, for example.

However, if such a condition is set, the difference in temperature gradients of $V_{reg}$ and $V_{sto}$ makes it inevitable that the constant voltage $|V_{reg}|$ will be greater than necessary at a minimum temperature $t_b$ of the guaranteed operating range, and, as a result, a problem arises in that power is wasted.

In other words, there is a large difference in temperature gradients between the constant voltage $V_{reg}$ and the oscillation-stopped voltage $V_{sto}$ in the prior-art constant-voltage generation circuit 100. This means that, if the $|V_{reg}|>|V_{sto}|$ condition is always satisfied to ensure oscillation at the high-temperature side (or low-temperature side), the value of $|V_{reg}|$ at the low-temperature side (or high-temperature side) will be comparatively high with respect to the voltage for ensuring oscillation, and thus power will be wasted.

As a result of the above analysis, the present inventors have discovered that an effective method of reducing the power consumption of the circuitry is to ensure that the constant voltage $V_{reg}$ and the oscillation-stopped voltage $V_{sto}$ have similar temperature characteristics.

Third Observation

An effective method of reducing the power consumption of portable electronic equipment and timepieces is to reduce the power supply voltage itself.

However, reducing the power supply voltage itself increases the effects of variations in the threshold voltages of the MOSFETs 16 and 18 comprised within the signal inversion amplifier 14, which is highly likely to cause a problem in that the oscillation of the crystal oscillation circuit 10 fails.

In other words, if the power supply voltage itself is reduced, the threshold voltages $V_{th}$ of the MOSFETs 16 and 18 take up a larger proportion of the power supply voltage $V_{ss}$, making it difficult to ensure an operating margin for the MOSFETs. Therefore, if subtle errors occur in impurity implantation during the forming of MOSFETs in the fabrication of the semiconductor device, the variations in threshold voltage caused thereby are highly likely to reduce the yield of completed devices.

The present inventors have observed that the power consumption can be reduced even further by developing an oscillation circuit 10 that has few oscillation failures, even when there are variations in threshold voltage caused by these subtle errors in impurity implantation.

Embodiments of this invention are discussed below, based on the above observations.

1. First Embodiment

A first embodiment of the present invention will now be described.

EXAMPLE 1

Figure 1A:
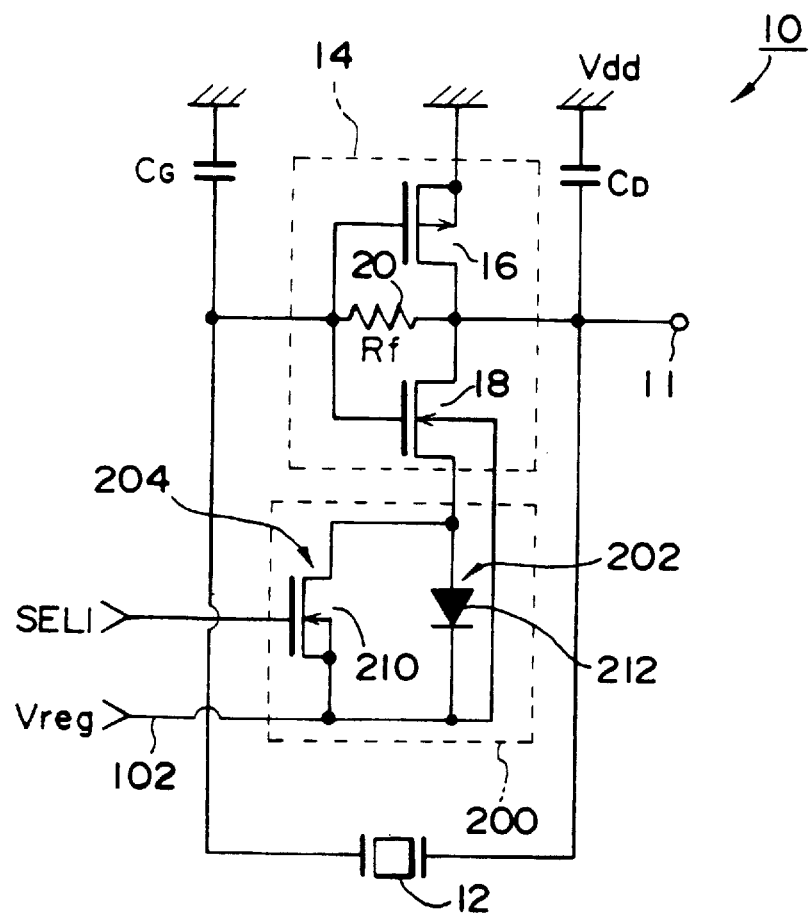
FIGS. 1A and 1B are a schematic view and a timing chart of a crystal oscillation circuit of Example 1.

An example of a crystal oscillation circuit in accordance with this first embodiment is shown in FIG. 1A. Note that components corresponding to those shown in FIG. 14 are denoted by the same reference numbers and further description thereof is omitted.

Oscillation Circuit

The crystal oscillation circuit 10 of this example comprises the signal inversion amplifier 14 and a feedback circuit.

This signal inversion amplifier 14 is connected to a first potential side and a lower second potential side, and is driven by a power supply delivered by the potential difference between these two potentials. In this case, the first potential is set to the ground voltage $V_{dd}$ and the second potential is set to the negative power supply potential $V_{reg}$ supplied from the previously described constant-voltage generation circuit 100.

The signal inversion amplifier 14 comprises the PMOSFET 16 and the NMOSFET 18. The source and drain of the PMOSFET 16 are connected to ground ($V_{dd}$) and an output terminal 11, respectively, and a feedback signal is input to the gate thereof.

The drain of the NMOSFET 18 is connected to the output terminal 11 (in this case, the drain of the FET 16) and the source thereof is connected to a control circuit 200, which is described below. In addition, a feedback signal supplied from the feedback circuit is input to the gate of this NMOSFET 18.

The configuration of this example is characterized in the provision of the control circuit 200 that controls the back gate voltage between the back gate and the source of an FET in the signal inversion amplifier 14.

The control circuit 200 of this example controls the back gate voltage of the FET 18 of the pair of MOSFETs 16 and 18 of the signal inversion amplifier 14.

In this case, the NMOSFET 18 that is the object of this back gate voltage control is configured in such a manner that the constant voltage $V_{reg}$ supplied from the constant-voltage generation circuit 100 is applied to the back gate thereof.

The control circuit 200 controls the potential between the source and back gate of this NMOSFET 18 by controlling the potential of the source of the FET 18 in several stages. This control makes it possible to provide several stages of switching control over the threshold voltage $V_{thn}$ of the MOSFET 18 and, as a result, reduce the power consumption of the oscillation circuit 10 when it is driven to oscillate.

The description now turns to the body effect of a substrate bias, which is the basis of this back gate control.

Substrate Bias

The control circuit 200 utilizes the body effect of a substrate bias to control the threshold voltage $V_{thn}$ of the NMOSFET 18 that forms part of the signal inversion amplifier 14.

When power is applied to the crystal oscillation circuit 10, the back gate voltage expressed by the difference between the source potential and the back gate potential of the NMOSFET 18 is set to a value close to zero. This starts the oscillation of the crystal oscillation circuit 10 in a state in which the threshold voltage $V_{thn}$ of the NMOSFET 18 is low.

After the oscillation of the crystal oscillation circuit 10 has stabilized, the back gate voltage of the NMOSFET 18 is controlled by the control circuit 200 to be high. This ensures that the crystal oscillation circuit 10 oscillates in a state in which the threshold voltage $V_{thn}$ of the NMOSFET 18 is set to be high.

Controlling the back gate voltage of the MOSFET 18, which is the potential difference between the source and back gate potentials thereof, ensures that the threshold voltage $V_{thn}$ of the MOSFET 18 can be varied so that the current characteristic between source and drain varies with respect to the voltage between gate and source in a sub-threshold region.

If, for example, the potential of the back gate of the NMOSFET is the same as that of the source thereof, the threshold voltage of that NMOSFET is lowered and also the OFF-state current thereof increases. Alternatively, if the potential of the back gate differs from that of the source, the threshold voltage of the NMOSFET rises and also the OFF-state current thereof decreases.

A PMOSFET has similar characteristics If, for example, the potential of the back gate is the same as that of the source, the absolute value of the threshold voltage of the PMOSFET drops and also the absolute value of the OFF-state current thereof increases. Alternatively, if the potential of the back gate differs from that of the source, the absolute value of the threshold voltage of the PMOSFET rises and also the absolute value of the OFF-state current thereof decreases.

These characteristics are used to create a situation wherein the absolute value of the threshold voltage of a MOSFET is reduced to form a sub-threshold region characteristic, for example. In other words, putting the source and the back gate at the same potential causes the absolute value of the threshold voltage of the MOSFET to fall and also ensures that a large current flows between drain and source. This speeds up the switching control of the MOSFET and also improves the driving capability thereof, enabling the semiconductor device to operate at high speed.

Conversely, applying a voltage to the back gate of the MOSFET increases the absolute value of the threshold voltage of the MOSFET and also makes it possible to greatly reduce the absolute value of the OFF-state current. In addition, if the characteristic is changed to a state in which the absolute value of the threshold voltage of the MOSFET is high, the standby current can be made extremely small, thus enabling a reduction in the power consumption of the semiconductor device.

Expression 4 below is one way of expressing the body effect of a substrate bias. This expression represents the amount of increase in the absolute value of the threshold voltage in an enhancement type of MOSFET. In this case, K in Expression 4 is a constant, $\phi f$ is the Fermi level of the substrate, $C_o$ is the gate capacitance, and $V_{BG}$ is the potential difference (back gate voltage) between back gate and source. It can be seen from Expression 4 that the threshold voltage rises as the back gate voltage $V_{BG}$ increases.

$$\{K \cdot (2\phi f + V_{BG})\}^{1/2} \cdot 1/C_o \qquad (4)$$

Control Circuit

A specific example of the control circuit 200 will now be described. The control circuit 200 of this example comprises a rectifier element circuit 202 connected to the MOSFET 18 and a bypass circuit 204 of the rectifier element circuit 202, and is configured in such a manner that the back gate voltage of the transistor 18 is selectively set over a range comprising at least two stages, by turning on and off a controlling NMOSFET 210 that is provided in the bypass circuit 204 as a switching element.

The rectifier element circuit 202 of this example comprises a diode 212 that is provided in the forward direction between the source of the FET 18 and the line 102 that supplies the constant voltage $V_{reg}$. The bypass circuit 204 also comprises the controlling NMOSFET 210 that is connected in parallel to the diode 212. A selection signal SEL1 is input to the gate of the FET 210, with the configuration being such that the FET 210 is controlled selectively to turn on and off.

Figure 1B:
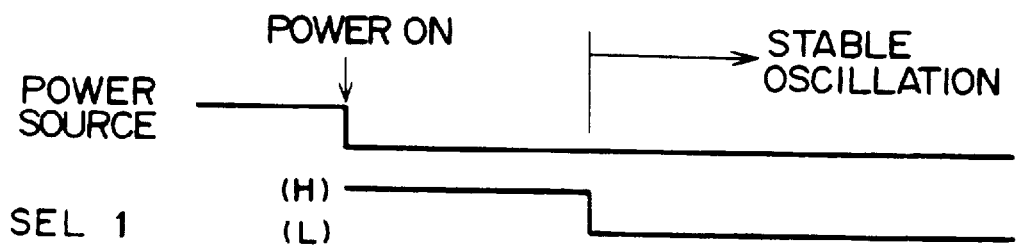

An operating timing chart of the crystal oscillation circuit 10 of this example is shown in FIG. 1B.

When power is applied to the crystal oscillation circuit 10, the selection signal SEL1 is output at high and the controlling NMOSFET 210 turns on. This short-circuits the source of the FET 18, which is the object of the control, to the output line 102. As a result, the potential difference between the source and back gate of the FET 18, in other words, the back gate voltage thereof, is controlled to be zero.

As a result, the threshold voltage $V_{thn}$ of the FET 18 of the signal inversion amplifier 14 is set to be small and the OFF-state leakage current increases, so that a large current flows between the source and drain thereof and also the absolute value $|V_{sta}|$ of the oscillation-start voltage is reduced. This makes it easy for the signal inversion amplifier 14 to start oscillating and it rapidly achieves a stabilized oscillation state.

Once the oscillation of the signal inversion amplifier 14 has stabilized, the selection signal SEL1 is switched and controlled to be low. This turns the FET 210 off, which connects the source of the FET 18 to the diode 212 via the line 102.

This causes the current flowing from the ground potential $V_{dd}$ side towards the signal inversion amplifier 14 to flow from the source of the FET 18, through the diode 212, and on towards the line 102. When this current passes through the diode 212, an absolute value of the source potential of the FET 18 is lowered by the voltage drop $V_f$ in the forward direction of the diode 212. As a result, the threshold voltage $V_{thn}$ of the NMOSFET 18 is set to be high and the OFF-state current thereof is reduced. In other words, the voltage drop $V_f$ in the forward direction of the diode 212 comes into effect so that the potential difference of the voltage applied between the source and the back gate of the NMOSFET 18 becomes the voltage drop $V_f$ in the forward direction of the diode 212. As a result, the back gate voltage rises, the threshold voltage $V_{thn}$ of the FET 18 is set higher, and thus the OFF-state leakage current in the FET 18 drops so that the current flowing between source and drain is reduced. This is effective for controlling the discharge of energy stored in the crystal oscillator, so that the crystal oscillation circuit 10 can be made to oscillate stably at a low power consumption.

In this manner, this example of the invention makes it possible to lower the absolute value $|V_{sta}|$ of the oscillation-start voltage of the signal inversion amplifier 14 when power is applied to the crystal oscillation circuit 10, to facilitate the start of oscillation, and, once stable oscillation has started, to use the energy stored in the crystal oscillator 12 efficiently to maintain this oscillation at a low power consumption.

Switching Circuit

The description now turns to a switching circuit 300 that shapes the selection signal SEL1.

Figure 2A:
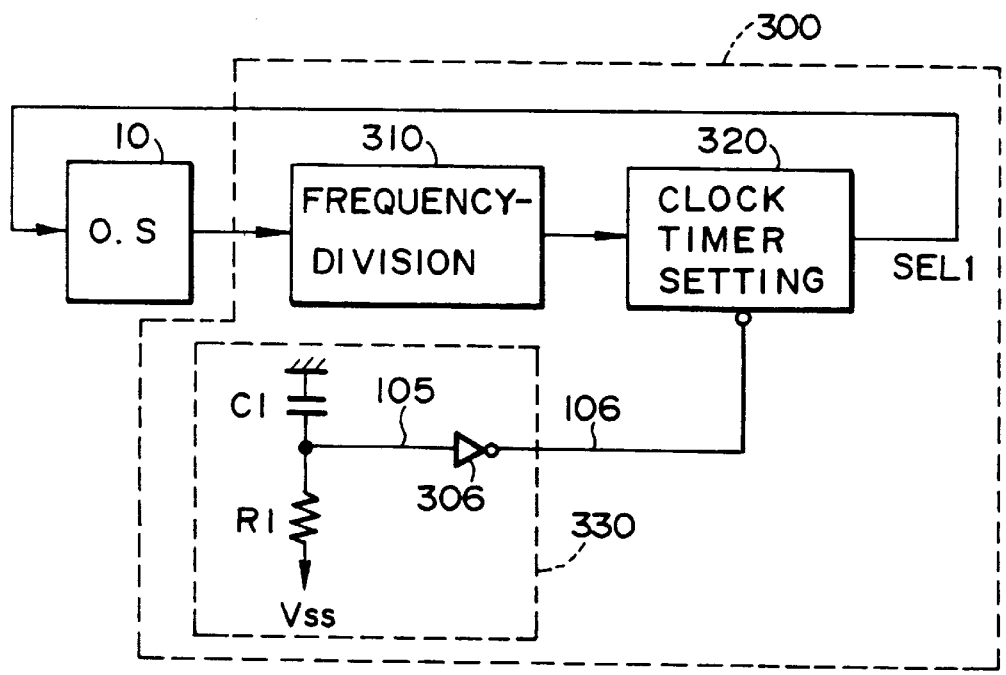
FIGS. 2A and 2B are a schematic view and a timing chart of a switching circuit of Example 1.
Figure 2B:
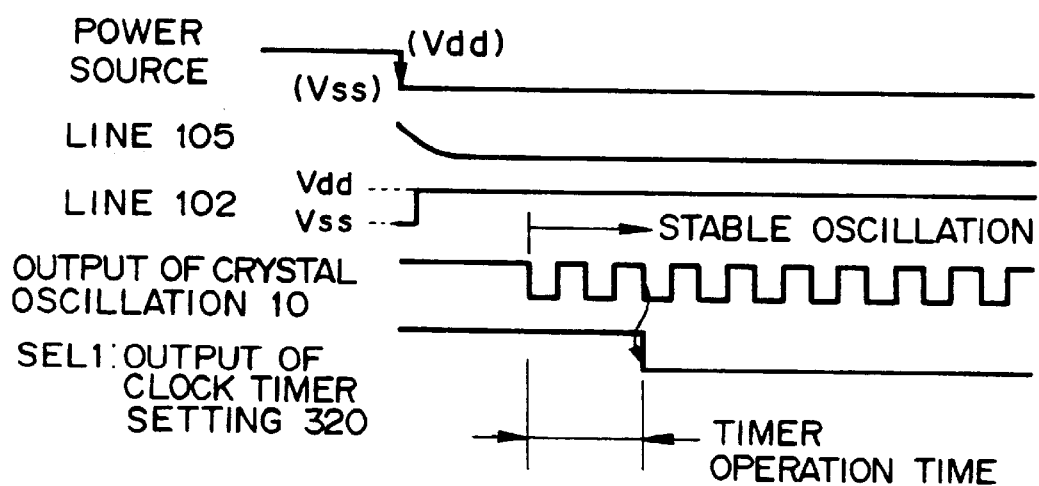

The functional blocks of this switching circuit 300 are shown in FIG. 2A and a timing chart thereof is shown in FIG. 2B.

The switching circuit 300 of this example comprises a frequency-division circuit 310, a clock timer setting circuit 320, and a power-on detection circuit 330.

The power-on detection circuit 330 is configured of a capacitor C1 a resistor R1, and a CMOS signal inversion amplifier 306.

The capacitor C1 and resistor R1 are connected in series, and the ground voltage $V_{dd}$ and the power supply voltage $V_{ss}$ are applied to the two ends thereof.

Therefore, as shown in FIG. 2B, when the power source $V_{ss}$ and $V_{reg}$ are applied to the circuitry, the crystal oscillation circuit 10 and the switching circuit 300 are activated. Simultaneously with this application of power, a current flows within the power-on detection circuit 330 from the ground potential $V_{dd}$ side thereof, through the capacitor C1 and resistor R1, and on towards the power source potential $V_{ss}$ side. In other words, immediately after the power is applied, the potential of a line 105 at the ground potential $V_{dd}$ gradually drops as the charge of the capacitor C1 proceeds, to approach the potential of the power source $V_{ss}$.

Therefore, immediately after power is applied, the signal inversion amplifier 306 outputs a power-on detection signal at the potential of $V_{ss}$ to a line 106. When the potential of the line 105 falls under a predetermined reference value, the output potential of the line 106 is switched from $V_{ss}$ and is output at the ground potential $V_{dd}$.

The clock timer setting circuit 320 is set by the input of a power-on detection signal at the potential $V_{ss}$ thereto through the line 106. The high-level selection signal SEL1 is then output to the gate of the FET 210 of the crystal oscillation circuit 10.

This causes the FET 210 to turn on and set the back gate voltage of the FET 18 of the signal inversion amplifier 14 to zero. This means that the crystal oscillation circuit 10 rapidly rises to a stabilized oscillation state, as previously described.

If the oscillation of the crystal oscillation circuit 10 starts in this manner, the oscillation output from the output terminal 11 thereof is input to the frequency-division circuit 310. If the frequency of the oscillation output of the crystal oscillation circuit 10 is assumed to be 32 kHz at this time, by way of example, the frequency-division circuit 310 divides a clock signal thereof to a predetermined frequency, such as 1 Hz, and outputs the thus-divided output to the clock timer setting circuit 320.

The clock timer setting circuit 320 is set at the point at which the signal at the $V_{ss}$ potential is input from the signal line 106, as previously described, and is controlled to be in a state in which it is capable of accepting a frequency-divided output from the frequency-division circuit 310. When a frequency-divided clock signal at 1 Hz is input from the frequency-division circuit 310, therefore, the clock timer setting circuit 320 counts this frequency-divided clock signal and, at the point at which the count reaches a predetermined value, controls the switching of the level of the selection signal SEL1 from high to low.

This controls the oscillation circuit 10 of FIG. 1A, particularly the turning off of the FET 210 comprised within the control circuit 200, so that the previously described back gate voltage of $V_f$ is applied between the source and the back gate of the FET 18. This sets the threshold voltage of the FET 18 to be high, as previously described, which implements switching control such that the oscillation circuit 10 operates at a low power consumption in a stable oscillation state.

Modification

Figure 3A:
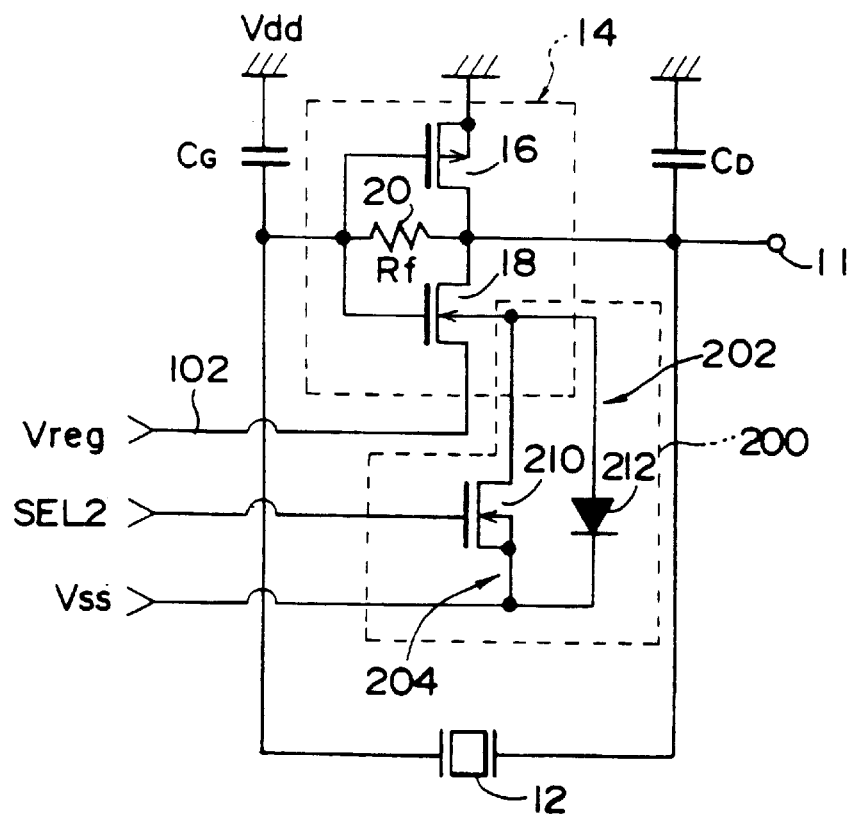
FIGS. 3A and 3B are a schematic view and a timing chart of a crystal oscillation circuit of Example 1 of Embodiment 1.
Figure 3B:
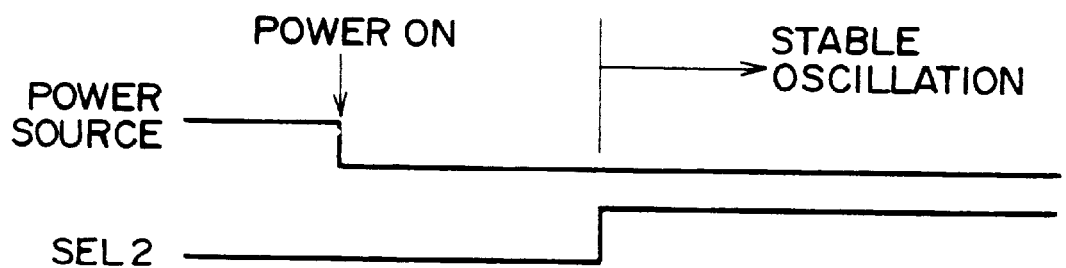

A modification of the oscillation circuit 10 of Example 1 is shown in FIG. 3A and a timing chart thereof is shown in FIG. 3B. The oscillation circuit 10 relating to this modification is characterized in that the relationship between the control circuit 200 and the NMOSFET 18 is modified.

In this oscillation circuit 10, the source of the FET 18 is connected to the line 102 that supplies the constant voltage $V_{reg}$.

In addition, the rectifier element circuit 202 and the bypass circuit 204 that configure the control circuit 200 are connected between the back gate of the FET 18 and the power source potential $V_{ss}$. Note that in this case the power source potential $V_{ss}$ has a negative potential, and the absolute value $|V_{ss}|$ thereof is set to be greater than the absolute value $|V_{reg}|$ of the constant voltage.

The controlling NMOSFET 210 is selectively switched on and off by applying a selection signal SEL2 to the gate thereof, to enable multi-stage switching control of the back gate potential of the FET 18. This makes it possible to achieve an operational effect that is similar to that of Example 1.

Note that the selection signal SEL1 generated by the circuit of FIG. 2A could be used as the selection signal SEL2 of this modification by inverting the selection signal SEL1 by using a signal inversion amplifier.

The description of this example stated that the start of stable oscillation of the crystal oscillation circuit 10 is detected and the voltage level of the selection signal is switched by using the clock timer setting circuit 320 to count the clock signal, by way of example. However, this clock timer setting circuit 320 need not be provided and the voltage level of the selection signal could equally well be switched by the power-on detection circuit 330. For example, the power-on detection circuit 330 could be configured so that the sizes of the capacitor C1 and resistor R1 of the power-on detection circuit 330 are adjusted to obtain a time constant that ensures the time until stable oscillation starts.

In addition, the above example was described as controlling the threshold voltage of one FET 18 comprised within the signal inversion amplifier, by way of example, but the present invention is not limited thereto and a configuration could be used in which threshold voltage is controlled in a similar manner by controlling the back gate voltage of the other FET 16.

EXAMPLE 2

Figure 4:
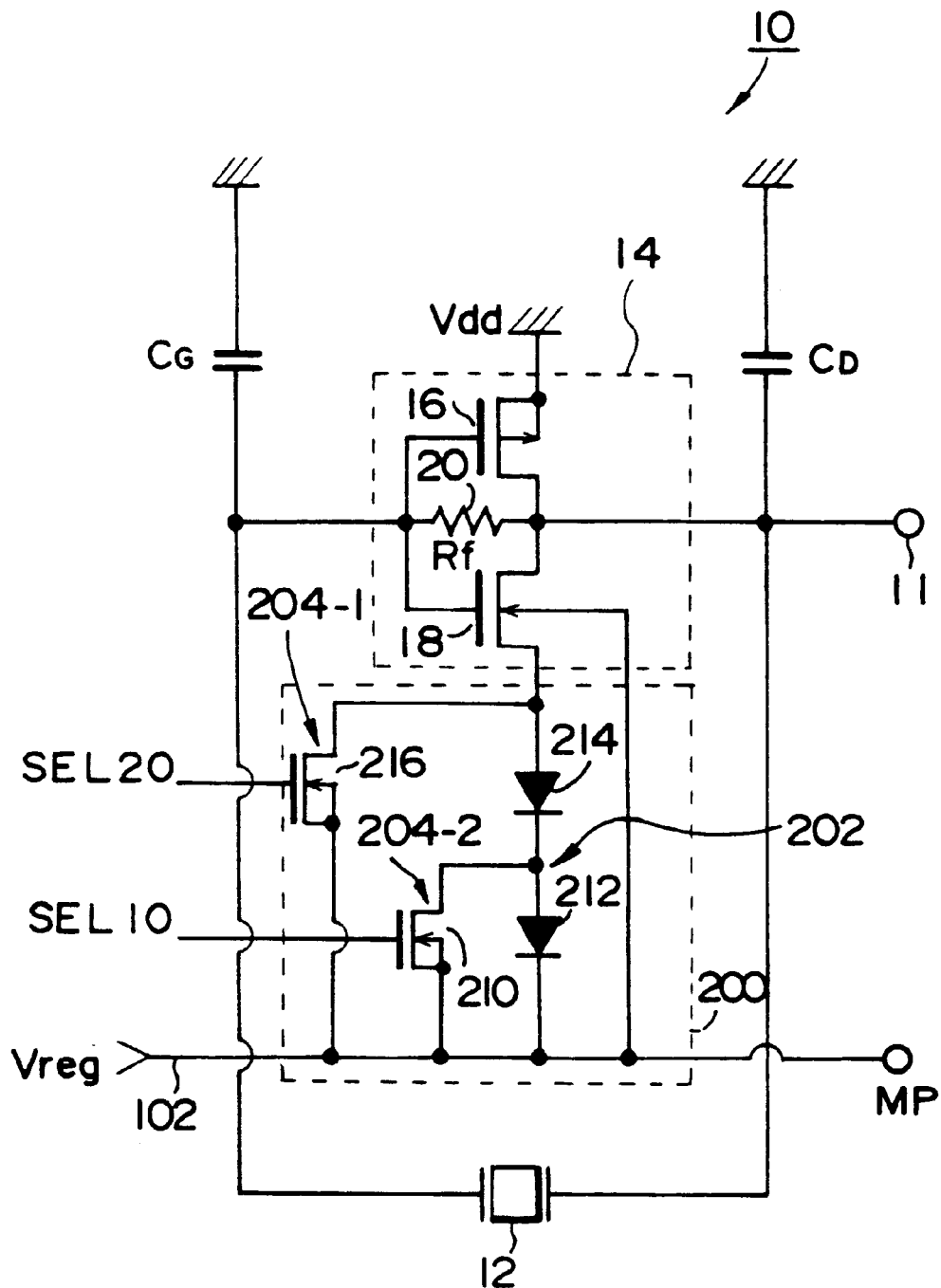
FIG. 4 is a schematic view of a crystal oscillation circuit of Example 2 of Embodiment 1.

The crystal oscillation circuit 10 in accordance with a second example of this aspect of the invention is shown in FIG. 4. Note that components corresponding to those shown in FIGS. 1, 3, and 14 are denoted by the same reference numbers and further description thereof is omitted.

Crystal Oscillation Circuit 10

This example is characterized in that the control circuit 200 is used to enable at least three stages of switching control of the threshold voltage $V_{thn}$ of the NMOSFET 18 within the signal inversion amplifier 14.

This control circuit 200 is configured of the rectifier element circuit 202, which comprises two diodes 214 and 212 connected in series in the forward direction, a bypass circuit 204-1 for the series-connected circuit of these diodes 214 and 212, and a bypass circuit 204-2 for the diode 212 alone. These bypass circuits 204-1 and 204-2 are controlled to turn on and off by controlling NMOSFETs 216 and 210, respectively.

More specifically, the back gate of the NMOSFET 18 of the signal inversion amplifier 14 is connected to the line 102 that supplies the constant voltage $V_{reg}$, and the source thereof is connected to the anode side of the rectifier element circuit 202 and one end of the bypass circuit 204-1.

The cathode side of the rectifier element circuit 202 and the other ends of the bypass circuits 204-1 and 204-2 are connected to the line 102.

Selection signals SEL20 and SEL10 are applied to the gates of the transistors 216 and 210, respectively, which function as switching elements, The above configuration makes it possible to implement at least three stages of switching control of the source potential of the NMOSFET 18, in other words, the back gate potential thereof, by predetermined combinations of on/off control of the controlling NMOSFETs 210 and 216.

In other words, controlling both of the FETs 216 and 210 to turn off ensures that the current that flows from the ground potential $V_{dd}$ side, through the signal inversion amplifier 14, and on to the power supply line 102 side passes through the diodes 214 and 212 so that a voltage drop of $2V_f$ is generated in the forward direction of the two diodes. A back gate voltage of a magnitude of $2V_f$ is therefore applied to the FET 18 in this case.

If the FET 210 is turned on and the FET 216 is turned off, this current flows through the diode 214 and the bypass circuit 204-2, then on to the power supply line 102. Thus the voltage drop within the control circuit 200 is simply the voltage drop $V_f$ at the diode 214. The back gate voltage of the FET 18 is therefore controlled to be $V_f$.

If the FET 216 is turned on and the FET 210 is turned off, this current flows completely through the bypass circuit 204-1 to the power supply line 102, so that the voltage drop at the control circuit 200 is substantially zero. The back gate voltage of the FET 18 is therefore zero in this case.

As described above, this example makes it possible to select any of the three voltages 0, $V_f$, and $2V_f$ as the back gate voltage of the NMOSFET 18 by controlling the selection signals SEL10 and SEL20 supplied to the control circuit 200, which makes it possible to selectively control the threshold voltage of the FET 18 in three stages and thus implement the optimum driving of the oscillation circuit 10.

Switching Circuit 300

Figure 7A:
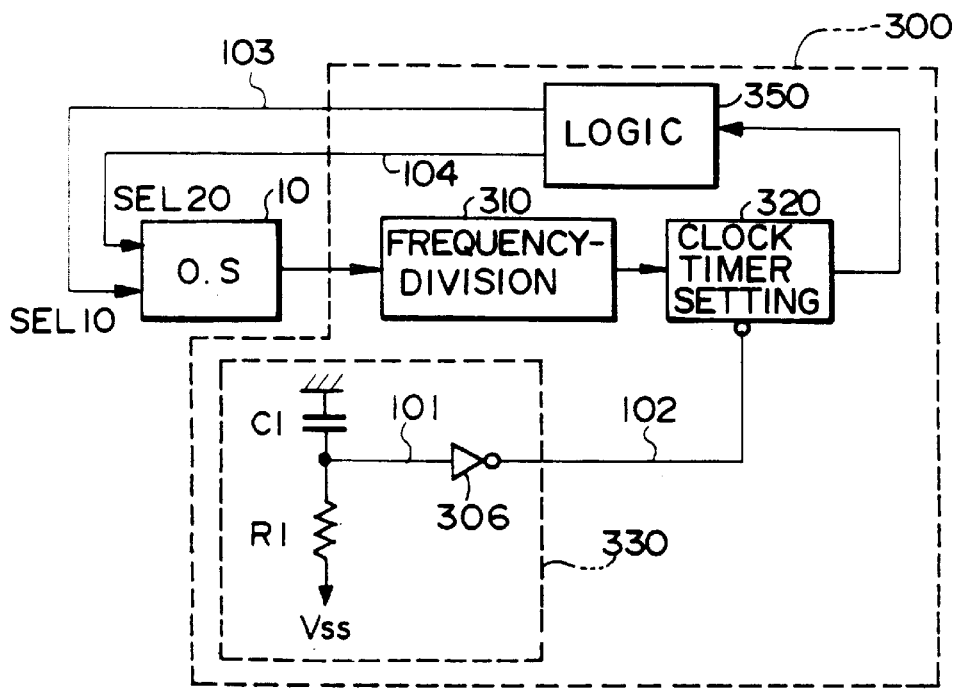
FIGS. 7A and 7B are a schematic view of the switching circuit of Example 2 of Embodiment 1 and a timing chart thereof.
Figure 7B:
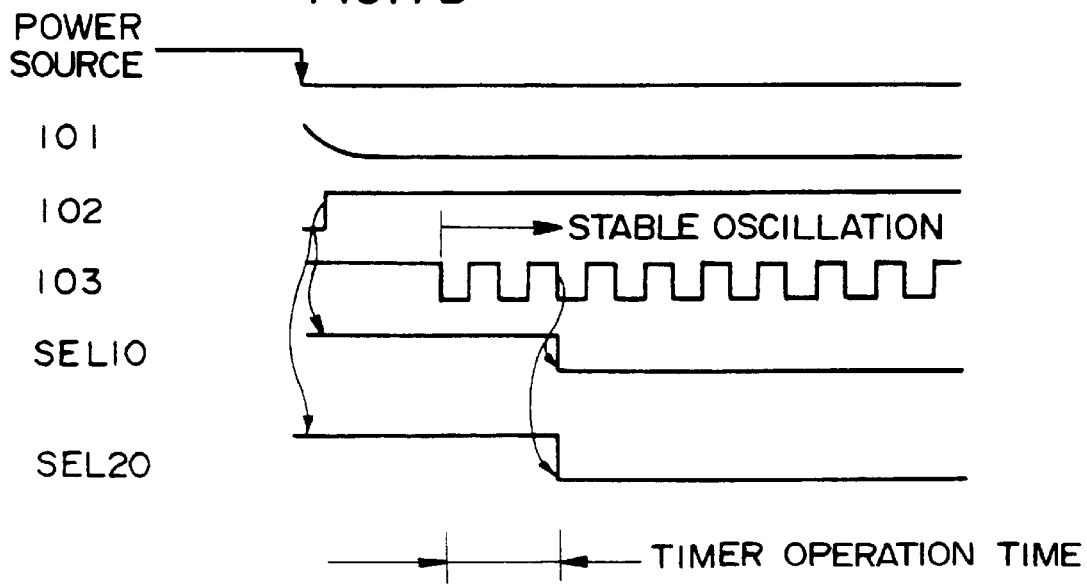

An example of the switching circuit 300 for supplying the selection signals SEL10 and SEL20 to the oscillation circuit 10 of Example 2 is shown in FIG. 7A and a timing chart thereof is shown in FIG. 7B. Note that components corresponding to those in previously described circuits are denoted by the same reference numbers and further description thereof is omitted.

To ensure that the source voltage of the NMOSFET 18 is selectively switched, the switching circuit 300 of this example comprises a logic circuit 350 that outputs the selection signals SEL10 and SEL20.

Figure 8:
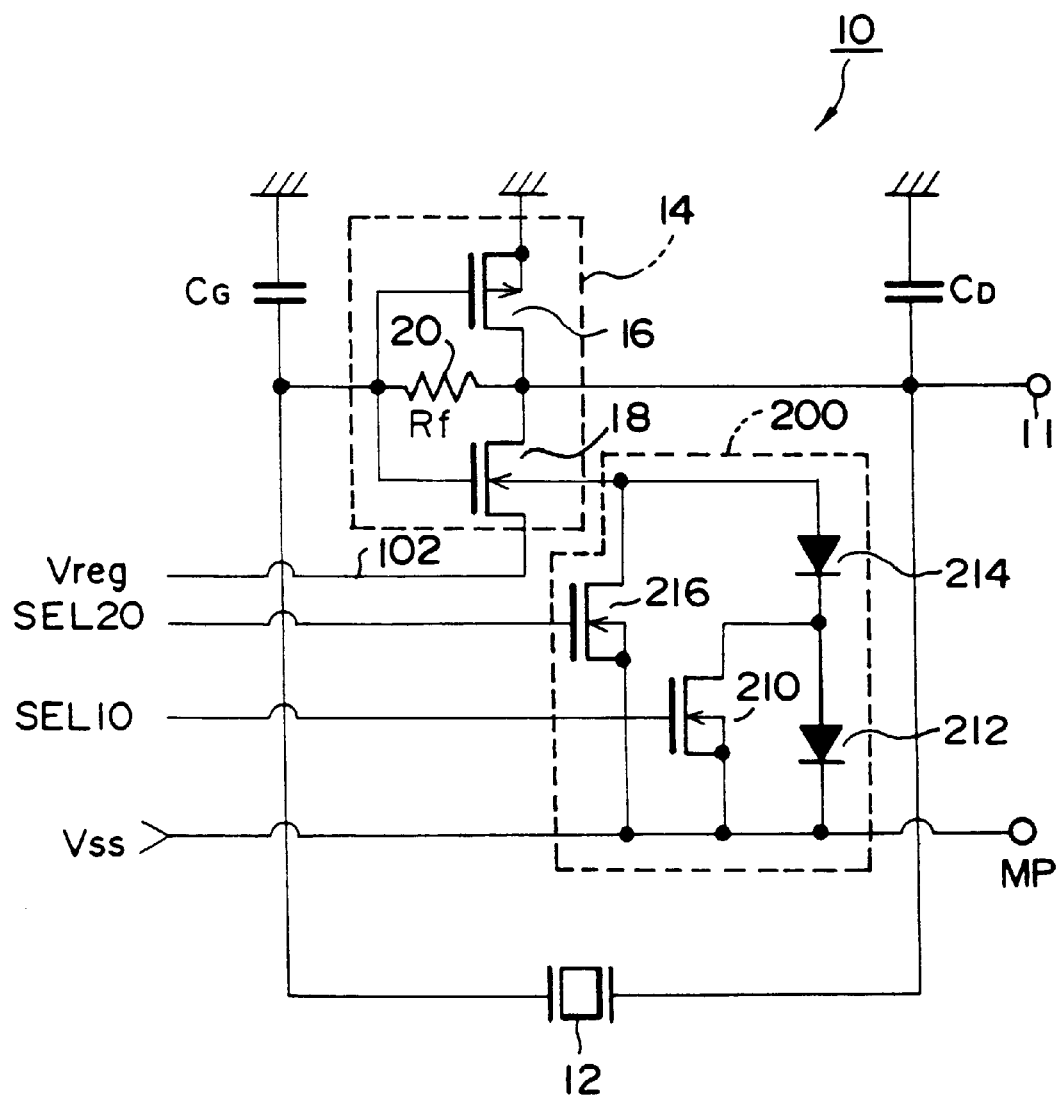
FIG. 8 is a schematic view of a variant of the crystal oscillation circuit of Modification of Example of Embodiment 1.

This logic circuit 350 is provided between the clock timer setting circuit 320 and the crystal oscillation circuit 10, which is configured as shown in FIG. 4 or FIG. 8. This logic circuit 350 generates the selection signals SEL10 and SEL20 by logical calculations of output signals of the clock timer setting circuit 320, and inputs these selection signals SEL10 and SEL20 through signal lines 103 and 104 to the gates of the controlling NMOSFETs 210 and 216, respectively, of the crystal oscillation circuit 10 of FIG. 4 or FIG. 8.

The configuration could be such that both of SEL10 and SEL20 are high when power is turned on, then both SEL10 and SEL20 go low after stable oscillation has started, for example.

With such a configuration, the oscillation circuit 10 of this example can select the back gate voltage from three different levels, as described above. Since the choice of back gate voltage can thus be increased, it is possible to allow for variations in characteristics due to the IC fabrication process in a more flexible manner than with Example 1. For example, fabrication variations could be considered to affect the threshold voltage, but in such a case the optimum back gate voltage can be selected to suit that threshold voltage.

The description now turns to the basis of this selection of back gate voltage.

First of all, the value of the negative constant voltage $V_{reg}$ of the output line 102 and the short-circuit current $I_s$ flowing through the signal inversion amplifier 14 are measured. A back gate voltage required during stable oscillation is selected on the basis of these measured values.

Figure 5:
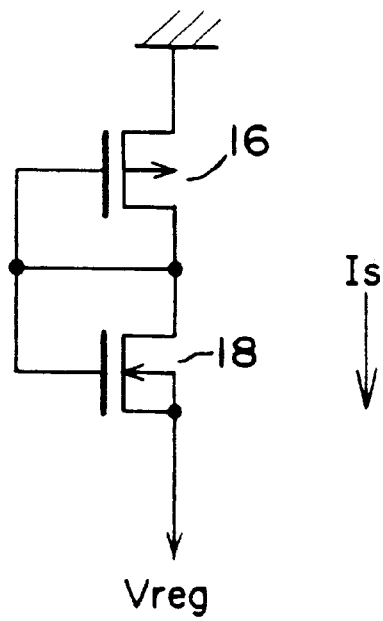
FIG. 5 is an explanatory view of a method of measuring the short-circuit current in the signal inversion amplifier of Example 2 of Embodiment 1.
Figure 6:
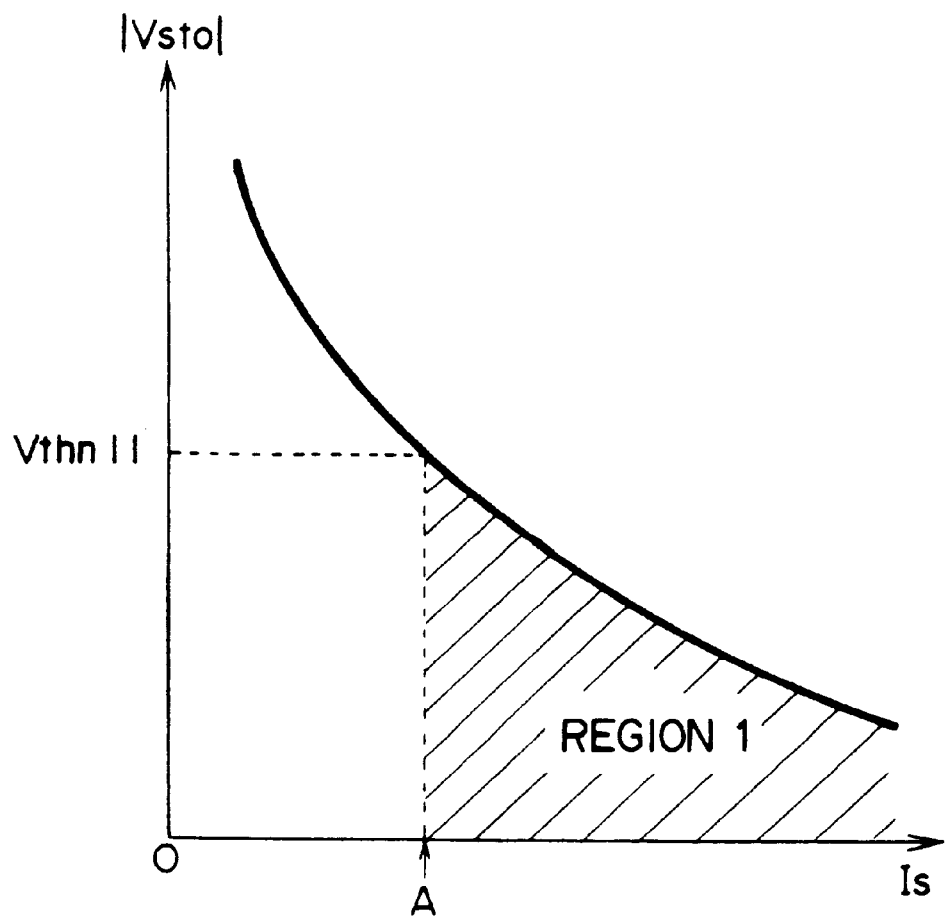
FIG. 6 is a graph of the relationship between the oscillation-stopped voltage and the short-circuit current.

The method used for measuring the short-circuit current $I_s$ that flows through the signal inversion amplifier 14 is shown in FIG. 5 and the relationship between the oscillation-stopped voltage of the oscillation circuit 10 and the short-circuit current $I_s$ is shown in FIG. 6. The relationship shown in FIG. 6 was obtained by using the circuit shown in FIG. 4 as the constant-voltage generation circuit 100, by way of example.

The short-circuit current $I_s$ of the signal inversion amplifier 14 is obtained by measuring the current flowing between $V_{dd}$ and $V_{reg}$ when a voltage having a potential difference that is the difference between the ground potential $V_{dd}$ and the constant voltage $V_{reg}$ is applied to the signal inversion amplifier 14, in a state in which the common gates and common drains of the FETS 16 and 18 are short-circuited as shown in FIG. 5.

To reduce the power consumption of the crystal oscillation circuit 10, it is necessary to satisfy the condition that the absolute value of the constant voltage $V_{reg}$ supplied to the signal inversion amplifier 14 is as small as possible, while satisfying the condition that the absolute value of the constant voltage $V_{reg}$ is greater than the absolute value of the oscillation-stopped voltage $V_{sto}$ of the oscillation circuit 10.

In other words, it is necessary to set the value of the constant voltage $V_{reg}$ applied from the constant-voltage generation circuit 100 to the crystal oscillation circuit 10 in such a manner that short-circuit current $I_s$ can be provided to ensure that the voltage of the FET 16 is at least as great as the ON-state voltage thereof, and also the absolute value of the constant voltage $V_{reg}$ is the necessary minimum value.

The absolute value $|V_{reg}|$ of the constant voltage depends on the constant-voltage control NMOSFET 114. In addition, the oscillation-stopped voltage $|V_{sto}|$ must be selected to be a value that is less than or equal to the ON-state voltage of the NMOSFET 18, that is, less than or equal to the threshold voltage $V_{thn}$ of the FET 18.

Therefore, to ensure a lower power consumption, it is necessary to set the short-circuit current $I_s$ and the oscillation-stopped voltage $|V_{sto}|$ to be within the range of region 1 shown in FIG. 6. On the other hand, while satisfying the above conditions, it is also necessary to select the back gate voltage in such a manner that the signal inversion amplifier 14 can oscillate stably within a range in which the on/off operation of the MOSFETs is guaranteed and also that the short-circuit current $I_s$ that flows through the signal inversion amplifier 14 is as small as possible, in order to implement the signal inversion amplifier 14 that can cope with recent trends towards constant-voltage power supplies.

In other words, a reduced power consumption can be implemented for the crystal oscillation circuit 10 by selecting the optimum back gate voltage for the NMOSFET 18 from the above 0, $V_f$, and $2V_f$ values based on the results of measuring the short-circuit current $I_s$, to satisfy these conditions.

This measurement of the short-circuit current $I_s$ is done during the process of inspecting the IC, but before the crystal oscillator 12 is mounted on the substrate, by using a test circuit and a test pad P connected to the test circuit (not shown in the figure), and supplying the various back gate voltages to the NMOSFET 18 comprised within the signal inversion amplifier 14. At this point, the short-circuit current $I_s$ flowing through the signal inversion amplifier 14 is measured. A back gate voltage is specified on the basis of these measurement results, such that the short-circuit current $I_s$ is as small as possible and is also within the range within which the on/off operation of the FET 18 is guaranteed.

This IC test is performed with the circuitry still in the wafer state. The short-circuit current is measured for each of the IC chips, using the test circuit and test pad provided within each IC chip. During this testing, only the signal inversion amplifier 14 and the control circuit 200 are active; the other components are in a non-active state.

Note that one or a plurality of these test pads P is provided, depending on the number of selection signals and the logic of the test circuitry. The output voltage levels of the selection signals SEL10 and SEL20 can be combined by combining the voltage levels of signals that are input to the test pad P, to give the above described three types of back gate voltage. The short-circuit current $I_s$ is measured in a state in which these selection signals SEL10 and SEL20 are input as combinations of different voltage levels. Note that the ground voltage $V_{dd}$ and constant voltage $V_{reg}$ are applied to the signal inversion amplifier 14 by using a monitor pad MP connected to the output line 102 to apply the constant voltage $V_{reg}$.

After the short-circuit current $I_s$ has been measured, the optimum tack gate voltage is specified from amongst the voltages 0, $V_f$, and $2V_f$ and the signal levels of the selection signals SEL10 and SEL20 are specified accordingly.

The logic circuit 350 outputs the selection signals SEL10 and SEL20 at the thus-specified levels during stable oscillation.

At start-up, the logic circuit 350 also outputs the selection signals SEL10 and SEL20 that have been set to levels such that a back gate voltage that is smaller than that for stable oscillation is applied to the FET 18.

Note that the above description of the crystal oscillation circuit 10 of Example 2 specified that there are two diodes for controlling the back gate voltage of the NMOSFET 18, but the present invention is not to be taken as limited thereto; the rectifier element circuit 202 could also be configured of three or more rectifier elements, such as diodes, connected in series.

Modification

A modification of Example 2 is shown in FIG. 8. In the oscillation circuit 10 of this modification, the source of the FET 18 is connected to the line 102 that supplies the constant voltage $V_{reg}$.

One end of the control circuit 200 is connected to the back gate of the FET 18 and the other end thereof is connected to the supply line of the power source $V_{ss}$.

The back gate potential of the FET 18 is controlled to switch over several stages by selectively turning on and off the control FETS 210 and 216.

This makes it possible to achieve an operational effect that is similar to that of the second example.

Verification of Oscillation Operation

Figure 9:
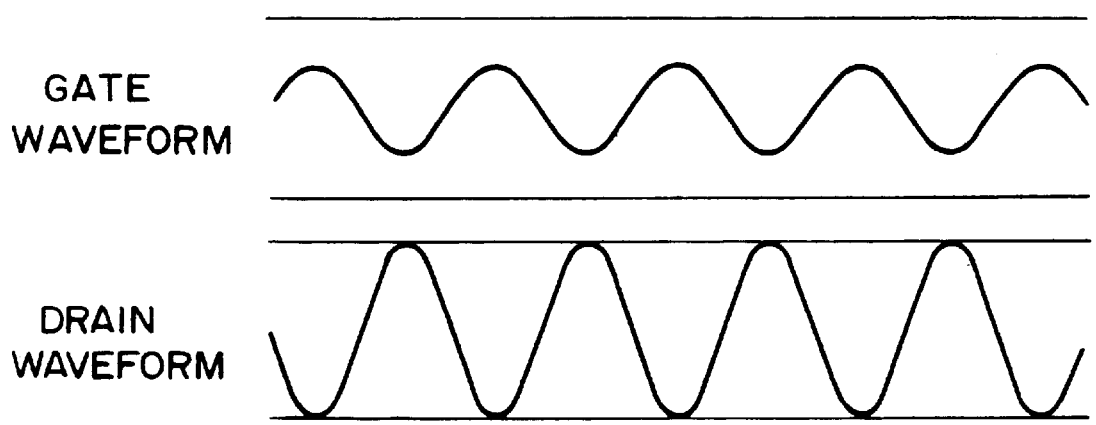
FIG. 9 is schematic views of the gate and drain waveforms of the crystal oscillation circuit of Examples 1 and 2 of Embodiment 1.

The back gate control characteristics of the FET 18 comprised within the signal inversion amplifier 14 of Examples 1 and 2 are shown in FIG. 9, In these graphs, time is plotted along the horizontal axes and the gate and drain waveforms of the FET 18 are plotted along the respective vertical axes.

If it is assumed that the optimum back gate voltage has been supplied to the FET 18 of the signal inversion amplifier 14, the crystal oscillation circuit 10 amplifies and outputs the gate input at the optimum driving capability of the signal inversion amplifier 14. During this time, the phase of the drain output of the FET 18 is inverted through 180 degrees with respect to the gate input.

The drain capacitance $C_D$ functions as a harmonic components blocking filter that cuts the harmonic components and selectively outputs the oscillation frequency components alone. The feedback circuit comprising the resistor $R_f$, drain capacitance $C_D$, crystal oscillator 12, and gate capacitance $C_G$ functions to invert the phase of the drain waveform through 180 degrees.

In this manner, it has been confirmed that the signal inversion amplifier 14 of the crystal oscillation circuit 10 of Examples 1 and 2 oscillates in a state in which the threshold voltage of the FET 18 is controlled optimally by the back gate voltage. It has been confirmed that not only can a lower power consumption be implemented for the oscillation circuit 10 of Examples 1 and 2, but also a stabilized oscillation output characteristic can be obtained.

EXAMPLE 3

Figure 10:
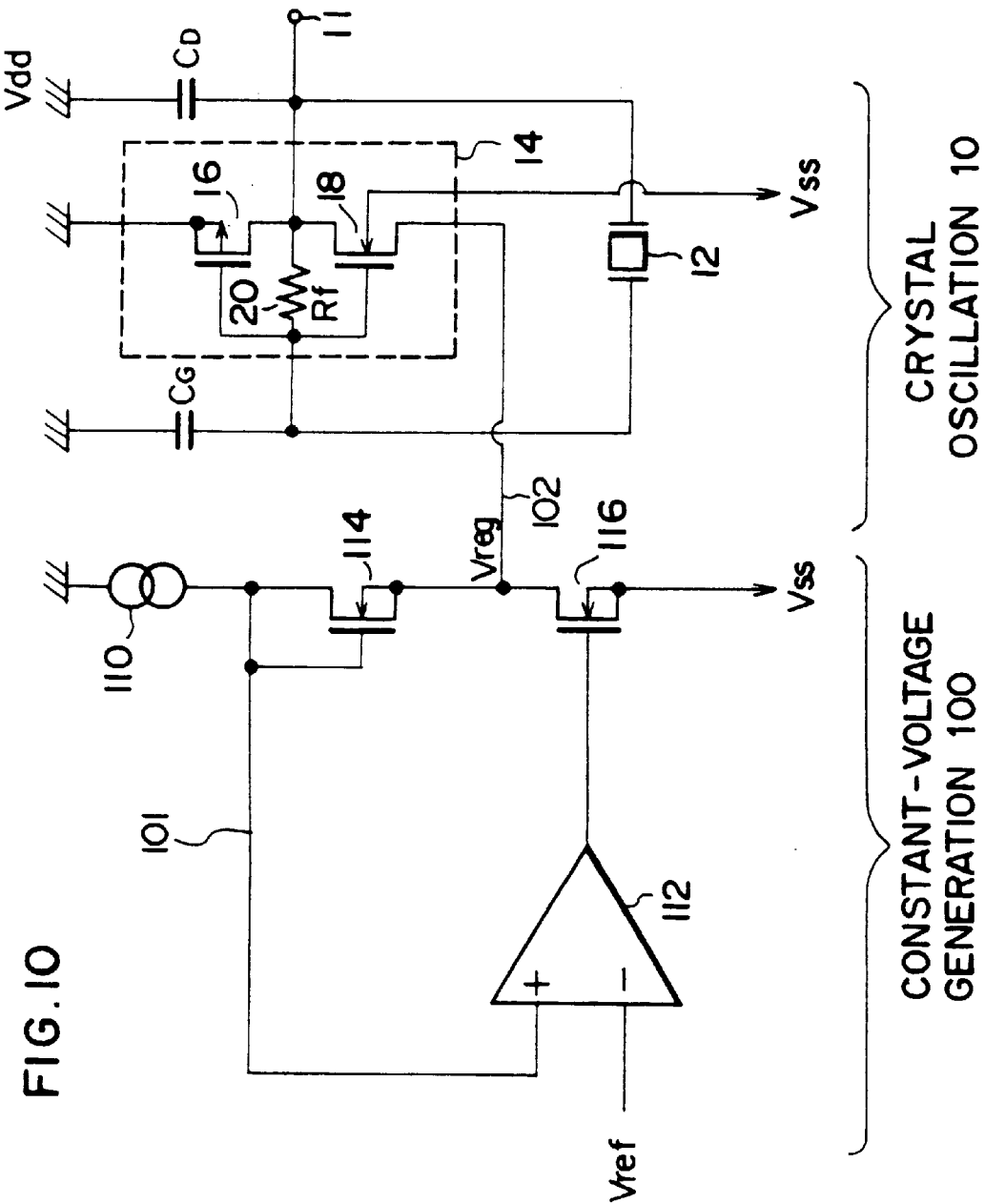
FIG. 10 is a schematic view of the circuitry of Example 3 of Embodiment 1.

A preferred example of the constant-voltage generation circuit 100 used in the crystal oscillation circuit 10 of this invention is shown in FIG. 10. Note that components corresponding to those shown in FIGS. 1, 3, 4, 8, and 14 are denoted by the same reference numbers and further description thereof is omitted.

This example is characterized in that the constant-voltage control NMOSFET 114 comprised within the constant-voltage generation circuit 100 and the NMOSFET 18 comprised within the signal inversion amplifier 14 are fabricated under the same conditions. This ensures that the threshold voltage $V_{thn}11$ of the constant-voltage control NMOSFET 114 and the threshold voltage $V_{thn}$ of the NMOSFET 18 can be designed to have the same value.

In other words, when an impurity is implanted during the fabrication of the constant-voltage control NMOSFET 114 and the NMOSFET 18, the same fabrication conditions can be applied for both of these FETs 114 and 18, by controlling the concentration of this impurity.

The temperature coefficient of a first constant voltage $V_{reg}$ is dependent on $(V_{ref}+V_{thn}11)$ and the temperature coefficient of the absolute value $|V_{sto}|$ of the oscillation-stopped voltage is dependent on $(|V_{thp}|+V_{thn})$. In this example, the threshold voltage $V_{thn}11$ is strongly correlated with the threshold voltage $V_{thn}$, as previously described, so that the temperature coefficient of the first constant voltage $V_{reg}$ can be expressed by $(V_{ref}+X\cdot V_{thn})$ (where x is a coefficient). Therefore, this first constant voltage $V_{reg}$ can be made to have the same temperature characteristic as the absolute value $|V_{sto}|$ of the oscillation-stopped voltage.

The constant-voltage generation circuit 100 supplies the negative first constant voltage $V_{reg}$ that has the above characteristic, to the source of the NMOSFET 18, This NMOSFET 18 is configured in such a manner that its threshold voltage $V_{thn}$ is controlled by the supply to the back gate thereof of a negative second constant-voltage $V_{ss}$ that has an absolute value that is greater than the absolute value of the first constant voltage $V_{reg}$ ($|V_{ss}|>|V_{reg}|$). This makes it possible to offset variations of the threshold voltage $V_{thn}11$ of the constant-voltage control NMOSFET 114 and the threshold voltage $V_{thn}$ of the NMOSFET 18.

In other words, the threshold voltage $V_{thn}$ of the NMOSFET 18 is dependent on the voltage applied to the source of the NMOSFET 18 and the voltage applied to the back gate thereof. In this case, the back gate voltage $V_{BG}$ of the NMOSFET 18 is given by Equation 5;

$$V_{BG}=|V_{ss}|-|V_{reg}| \tag{5}$$

Since $|V_{reg}|=|V_{ref}|+V_{thn}11$, as previously mentioned, Equation 5 can be rewritten to give Equation 6:

$$V_{BG}=|V_{ss}|-|V_{ref}|-V_{thn}11 \tag{6}$$

It can therefore be understood that variations in the threshold voltage $V_{thn}11$ of the constant-voltage control NMOSFET 114 affect the back gate voltage $V_{BG}$ of the NMOSFET 18, and these effects also cause variations in the threshold voltage $V_{thn}$ of the NMOSFET 18.

However, the NMOSFET 18 and the constant-voltage control NMOSFET 114 are fabricated under the same conditions. Therefore, variations in the threshold voltage $V_{thn}$ of the NMOSFET 18 can be cancelled by controlling the threshold voltage $V_{thn}11$ of the constant-voltage control NMOSFET 114. If, for example, the threshold voltage $V_{thn}11$ of the constant-voltage control NMOSFET 114 is too high, the rise in the back gate voltage $V_{BG}$ thereof will be small, so the threshold voltage $V_{thn}$ of the NMOSFET 18 will be low. If the threshold voltage $V_{thn}11$ of the constant-voltage control NMOSFET 114 is too low, the rise in the back gate voltage $V_{BG}$ thereof will be large, and thus the threshold voltage $V_{thn}$ of the NMOSFET 18 will be high.

Figure 11:
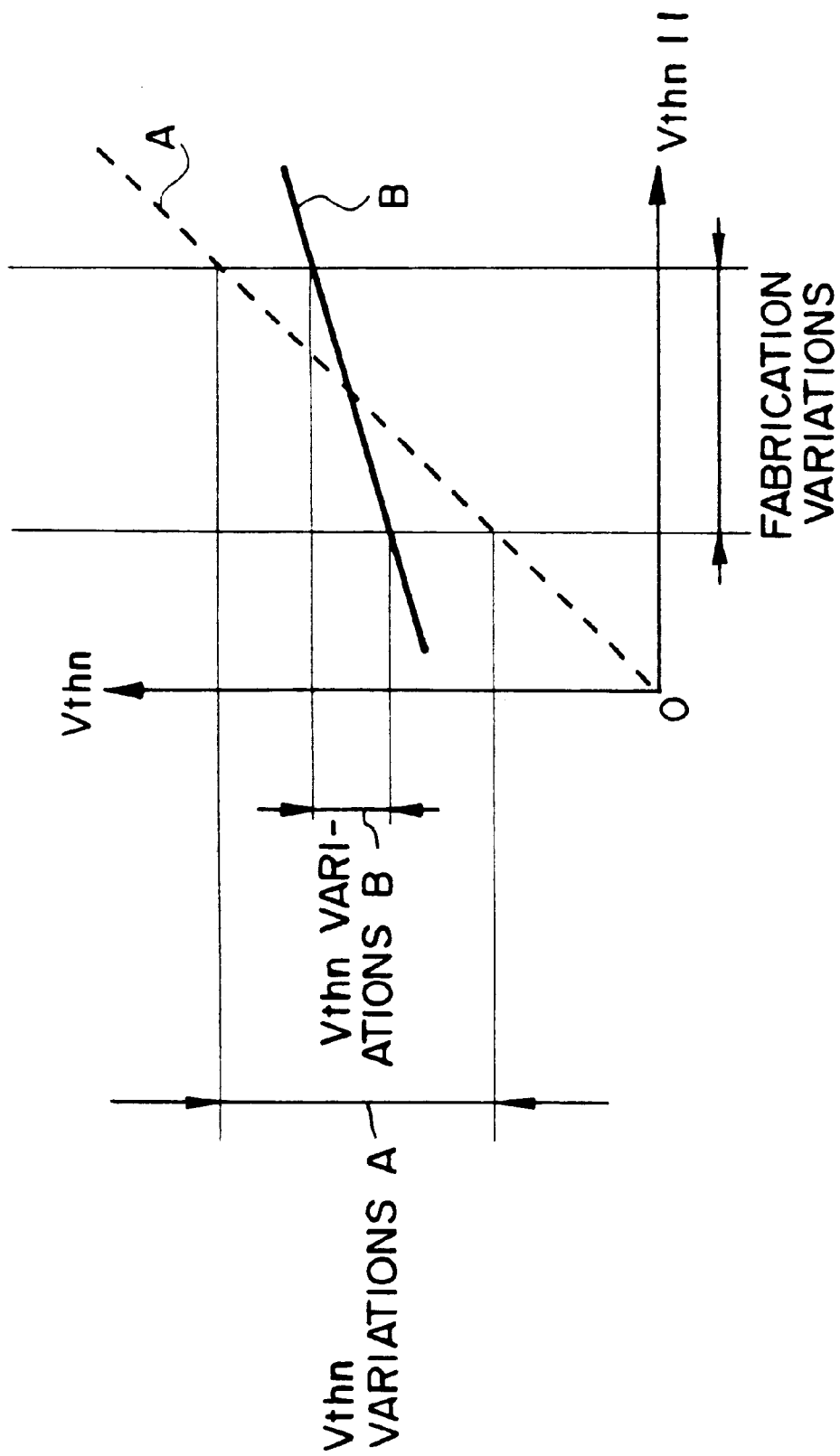
FIG. 11 shows comparative examples of data wherein the source and back gate of an NMOSFET are at the same potential and data wherein the source and back gate of an NMOSFET are at different potentials.

Comparative examples are shown in FIG. 11. These comparative examples show how the threshold voltage of the NMOSFET 18 varies to the degree likely during fabrication, both when the source of the NMOSFET 18 is at the same potential as the back gate thereof and when the source potential and the back gate potential are different, as in this example. In other words, these comparative examples are an example in which the body effect of a substrate bias is applied and an example in which the body effect of a substrate bias is not applied. In FIG. 11, the threshold voltage $V_{thn}11$ of the constant-voltage control NMOSFET 114 is plotted along the horizontal axis and the threshold voltage $V_{thn}$ of the NMOSFET 18 comprised within the signal inversion amplifier 14 is plotted along the vertical axis.

In FIG. 11, a broken line A represents the comparative example 1A which the body effect of a substrate bias is not applied (the relationship between the NMOSFET 18 and the constant-voltage control NMOSFET 114 in the circuit of FIG. 14). A solid line B represents the relationship between the NMOSFET 18 and the constant-voltage control NMOSFET 114 in the circuit of FIG. 10.

As shown by comparative example A, when the body effect of a substrate bias is not used, the threshold voltage $V_{thn}$ of the NMOSFET 18 varies with fabrication variations during the impurity implantation caused by the fabrication process.

However, the use of the body effect of a substrate bias comparative example B shows that it is possible to compensate for variations in the threshold voltage during the MOS fabrication process. Thus variations in the threshold voltage $V_{thn}$ of the NMOSFET 18 can be minimized, to produce an oscillation circuit 10 with stable characteristics.

In particular, the oscillation circuit 10 and constant-voltage generation circuit 100 of this example make it possible to automatically offset any variations in the threshold voltage produced during IC fabrication, without a substantial increase in the number of components, and thus implement an oscillation circuit 10 that oscillates stably.

Note that it should be obvious that the circuit shown in FIG. 10 is capable of providing similar effects if the oscillation circuit 10 of FIG. 1A, 2A, 3A, 4, or 8 is used instead of the oscillation circuit 10 of FIG. 10.

APPLICATION EXAMPLES

Figure 12:
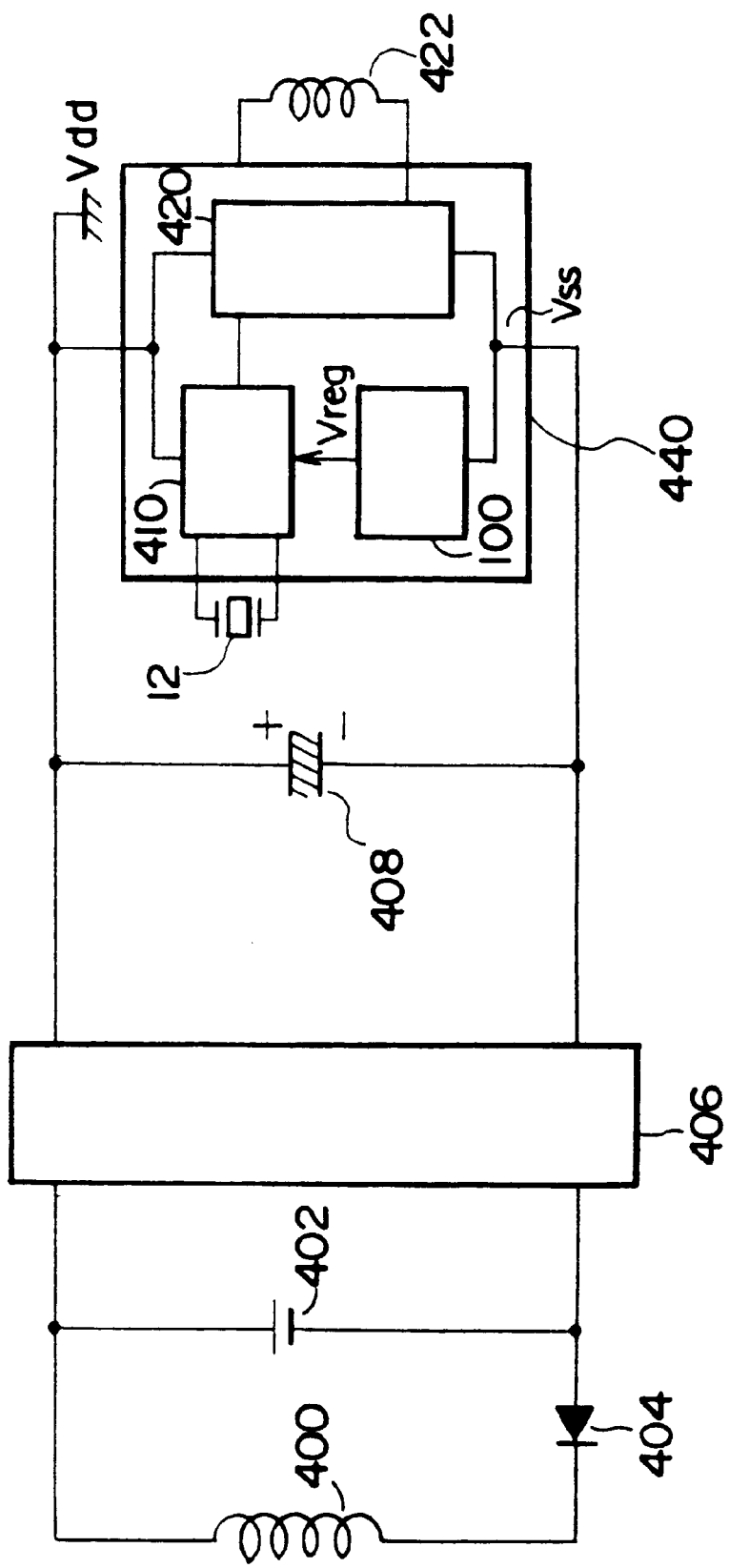
FIG. 12 is a functional block diagram of a timepiece to which this invention is applied.

An example of the electronic circuitry used in a wristwatch is shown in FIG. 12.

This wristwatch has an electrical power generating mechanism (not shown in the figure) built in. When the user moves the arm on which the wristwatch is worn, an oscillating weight of the electrical power generating mechanism rotates, a power-generation rotor is rotated at high speed by this kinetic energy, and an AC voltage is output from a power-generation coil 400 provided on a power-generation stator side thereof.

This AC voltage is rectified by a diode 404 and charges a secondary battery 402. This secondary battery 402 configures a main power source, together with a booster circuit 406 and an auxiliary capacitor 408.

When the voltage of the secondary battery 402 is too low to supply the drive voltage for the timepiece, the voltage of the secondary battery 402 is converted by the step-up circuit 406 to a voltage high enough to drive the timepiece, and is stored in the auxiliary capacitor 408. The voltage of the auxiliary capacitor 408 acts as a power supply to drive a timepiece circuit 440.

This timepiece circuit 440 is configured as a semiconductor device comprising the oscillation circuit 10 and constant-voltage generation circuit 100 of any of the above examples. This semiconductor device uses a crystal oscillator 12 that is connected by terminals to generate an oscillation output at a pre-set oscillation frequency, which is 32768 Hz in this case, and divide this oscillation output to output drive pulses of different polarity every second, These drive pulses are input to a drive coil 422 of a stepping motor that is connected to the timepiece circuit 440, This causes the stepping motor (not shown in the figure) to drive the rotor whenever one of the drive pulses is passed, to drive the seconds hand, minutes hand, and hours hand of the timepiece (not shown in the figure), and thus provide an analog display of the time on a display face.

In this case, the timepiece circuit 440 of this example comprises a power supply voltage circuit portion 420 that is driven by the voltage $V_{ss}$ supplied from the main power source, the constant-voltage generation circuit 100 that generates a predetermined constant voltage $V_{reg}$ of a lower value than that of the power supply voltage, and a constant-voltage operating circuit portion 410 that is driven by this constant voltage $V_{reg}$.

Figure 13:
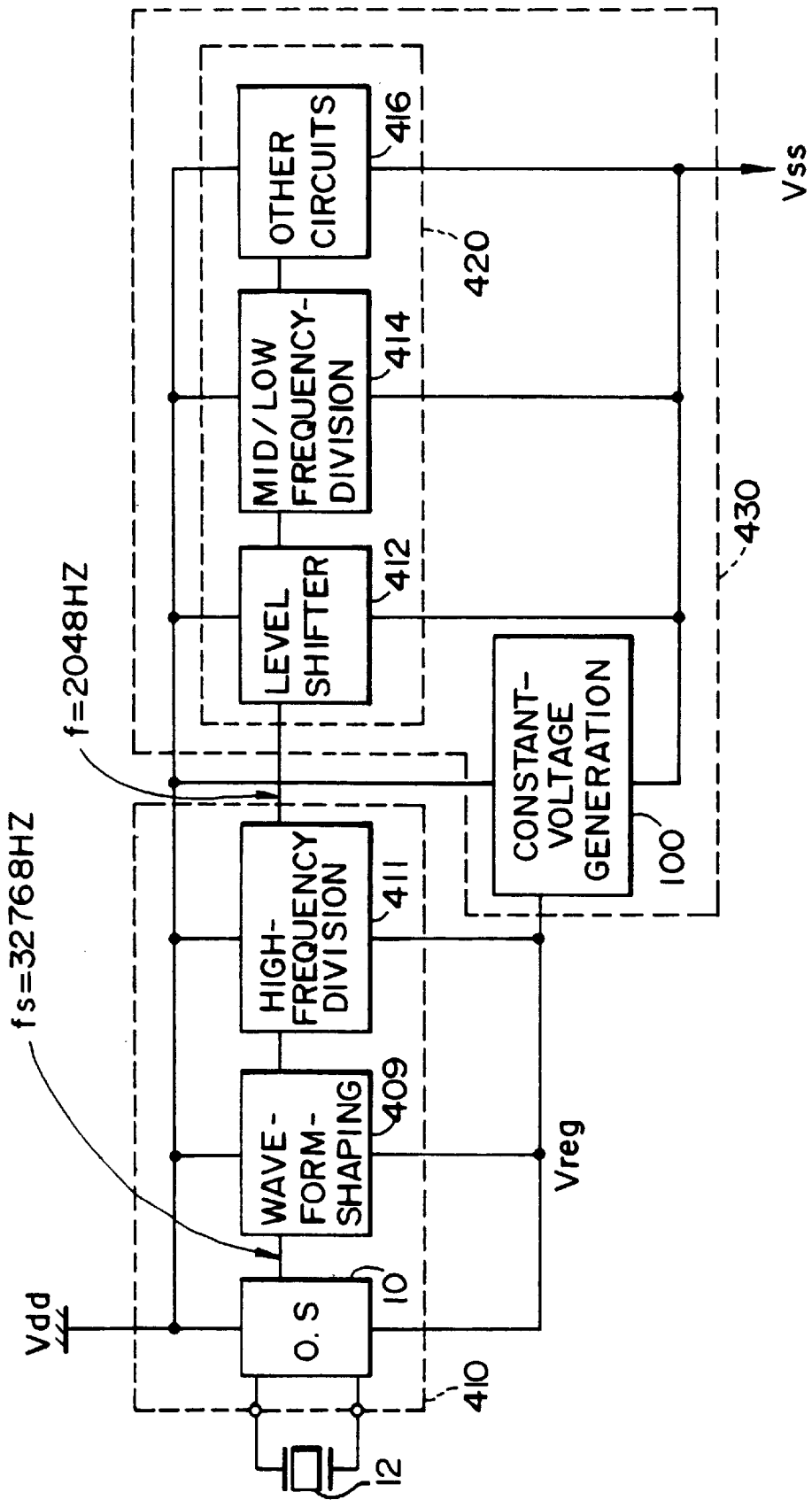
FIG. 13 is a functional block diagram of portable electronic equipment to which this invention is applied.

A functional block diagram of this timepiece circuit 440 is shown in FIG. 13.

The constant-voltage operating circuit portion 410 comprises the crystal oscillation circuit 10, which comprises the externally connected crystal oscillator 12, a waveform-shaping circuit 409, and a high-frequency division circuit 411.

The power supply voltage circuit portion 420 comprises a level shifter 412, a mid/low frequency-division circuit 414, and other circuits 416. Note that the power supply voltage circuit portion 420 and the constant voltage generation circuit 100 in the timepiece circuit 440 of this example form a power supply voltage operating circuit portion 430 that is driven by the voltage supplied from the main power source.

The crystal oscillation circuit 10 uses the crystal oscillator 12 to output a sine-wave output at a reference frequency fs of 32768 Hz to the waveform-shaping circuit 409.

After shaping this sine-wave output into a square wave, the waveform-shaping circuit 409 outputs it to the high-frequency division circuit 411.

The high-frequency division circuit 411 divides the reference frequency of 32768 Hz to 2048 Hz, then outputs that frequency-divided output to the mid/low frequency-division circuit 414 through the level shifter 412.

The mid/low frequency-division circuit 414 takes the signal that has been divided to 2048 Hz and further divides it to 1 Hz, then outputs it to the other circuits 416.

The other circuits 416 comprise a driver circuit that activates and drives a coil in synchronization with the 1-Hz frequency-divided signal, to drive a stepping motor for driving the timepiece in synchronization with this 1-Hz frequency-divided signal.

In addition to the power supply voltage operating circuit portion 430, which is driven by the power voltage $V_{ss}$ supplied from the main power source, the timepiece circuitry of this example is provided with the constant voltage operating circuit portion 410, which is driven by the constant voltage $V_{reg}$ which is lower, for the reason discussed below.

To ensure that this timepiece circuit maintains stable operation over a long time period, it is necessary to reduce the power consumption thereof.

Ordinarily, the power consumption of a circuit increases in proportion to signal frequency and circuit capacitance, and it is also proportional to the square of the power voltage supplied thereto.

If the timepiece circuitry is viewed in this case, one method of reducing the power consumption of the entire circuit would be to set the power voltage supplied to each circuit to a low value, such as $V_{reg}$. The constant-voltage generation circuit 100 can shape a minimum constant voltage $V_{reg}$ in a range that guarantees the oscillation of the crystal oscillation circuit 10.

If signal frequency is viewed, the timepiece circuitry can be classified broadly into the crystal oscillation circuit 10, the waveform-shaping circuit 409, and the high-frequency division circuit 411 wherein signal frequencies are high, and the other circuits 430. The frequency of such signals is in a proportional relationship with the power consumption of the circuit, as previously described.

The constant-voltage generation circuit 100 of this example takes the power voltage $V_{ss}$ supplied from the main power source and shapes the lower constant voltage $V_{reg}$ therefrom, then supplies it to the circuit portion 410 that handles high-frequency signals. In this manner, it is possible to efficiently decrease the power consumption of the entire timepiece circuitry by lowering the drive voltage supplied to the circuitry 410 that handles such high-frequency signals, without increasing the load on the constant-voltage generation circuit 100 too much.

As mentioned above, the timepiece circuit and incorporated electronic circuitry of this example comprise the crystal oscillation circuit 10 of any of the above examples, together with the constant-voltage generation circuit 100 connected thereto. It is therefore possible to supply a minimum constant voltage to the crystal oscillation circuit 10 while ensuring an operating margin for the signal inversion amplifier, regardless of fabrication variations, enabling reductions in the power consumptions of the electronic and timepiece circuitry. Therefore, not only can the oscillation be stabilized in such portable electronic equipment or a timepiece, as previously described, but also the lifetime of the battery used therein can be extended, thus increasing the utility of this portable electronic equipment or timepiece.

The above reasons also make it possible to ensure a suitable operating margin, even when there are variations in MOSFETs due to the fabrication process in timepieces or portable electronic equipment with internal silver batteries. In addition, this operating margin can be guaranteed and also the charging time can be shortened, even when there are MOS variations due to the fabrication process in a rechargeable wristwatch wherein a secondary battery formed by lithium ions is used as a power supply.

2. Second Embodiment

A second embodiment of this invention will now be described.

An oscillation circuit in accordance with this embodiment comprises: an oscillation-inducing signal inversion amplifier group comprising a plurality of oscillation-inducing signal inversion amplifiers configured by using transistors having different threshold voltages, wherein one of these oscillation-inducing signal inversion amplifiers can be selected for use; and a feedback circuit having a crystal oscillator connected to an output side and an input side of the oscillation-inducing signal inversion amplifier group, for inverting the phase of an output signal from the oscillation-inducing signal inversion amplifier group and feeding that signal back to the oscillation-inducing signal inversion amplifier group as an input.

This configuration makes it possible to select the oscillation-inducing signal inversion amplifier that has the optimum capability, from amongst this group of oscillation-inducing signal inversion amplifiers, thus enabling a reduction in the power consumption of the oscillation circuit.

This oscillation circuit preferably further comprises a selection circuit for selecting one of the oscillation-inducing signal inversion amplifiers from amongst the group of oscillation-inducing signal inversion amplifiers.

This oscillation circuit is preferably formed on the same substrate as a test circuit. This test circuit is used in a state in which the crystal oscillator is not mounted on the substrate, to sequentially select the oscillation-inducing signal inversion amplifiers and measure the short-circuit current of each of the selected oscillation-inducing signal inversion amplifiers. One oscillation-inducing signal inversion amplifier is specified from this group of oscillation-inducing signal inversion amplifiers and that oscillation-inducing signal inversion amplifier is selected by the selection circuit.

In this manner, the short-circuit current is measured for each of the oscillation-inducing signal inversion amplifiers in the group of oscillation-inducing signal inversion amplifiers formed on the IC chip or wafer. This makes it possible to obtain the optimum oscillation-inducing signal inversion amplifier, regardless of fabrication conditions, and, as a result, improve the yield of completed devices. This also makes it possible to obtain an oscillation circuit having an oscillation characteristic that is stable and also has a low power consumption.

Note that the selection circuit and the test circuit could also be formed on the same substrate.

The configuration could also be such that the oscillation-inducing signal inversion amplifiers are selected through the test circuit, by connecting this test circuit to test pads and controlling the voltages applied to those test pads.

Thus it is possible to shape a signal for selecting the oscillation-inducing signal inversion amplifiers through the test circuit, by combinations of voltages applied to the test pads.

The selection circuit is preferably formed in such a manner that a plurality of unit circuits are provided to correspond to the oscillation-inducing signal inversion amplifiers, and also a plurality of pads are connected thereto.

In addition, this plurality of unit circuits is preferably formed in such a manner that each comprises one fuse, non-volatile memory, or memory element, and the oscillation-inducing signal inversion amplifier is selected by applying a voltage to the appropriate pad.

The oscillation-inducing signal inversion amplifier group preferably comprises at least: a first oscillation-inducing signal inversion amplifier comprising a transistor having a first threshold voltage; a second oscillation-inducing signal inversion amplifier comprising a transistor having a second threshold voltage that differs from the first threshold voltage; and a third oscillation-inducing signal inversion amplifier comprising a transistor having a third threshold voltage that differs from the first and second threshold voltages.

This configuration makes it possible to adjust to an optimum value the source-drain current flowing through the oscillation-inducing signal inversion amplifier to be selected, and, as a result, set the oscillation output of the crystal oscillation circuit to an optimum state, thus enabling a lower power consumption.

The power supply line of these oscillation-inducing signal inversion amplifiers uses a configuration such that it is connected to a first potential side and a second potential side of a potential that differs from the first potential.

In this case, the potential difference between the first and second potentials is greater than the absolute value of an oscillation-stopped voltage of the oscillation-inducing signal inversion amplifier.

The selection of the oscillation-inducing signal inversion amplifier is done by: ensuring that the short-circuit current flowing through the oscillation-inducing signal inversion amplifier to be greater than the ON-state current of the transistor that configures the oscillation-inducing signal inversion amplifier to be selected; and also ensuring that the potential difference between the first and second potentials is a minimum-voltage.

This makes it possible to ensure that a stable, less power-consuming oscillation is performed more reliably.

The constant-voltage generation circuit comprises: a constant-current power source for supplying a constant current, wherein one end thereof is connected to the first potential side; a plurality of constant-voltage control transistors provided in a constant-current path in such a manner that one end thereof is connected to the constant-current power source side and another end thereof is connected to a constant-voltage output line side, for outputting a comparison voltage for generating a constant voltage; an operational amplifier having one terminal to which the comparison voltage is input and another terminal to which a given reference voltage is input; and an output transistor provided in a constant-current path such that one end thereof is connected to the constant-voltage output line side, the resistance thereof is controlled by inputting an output of the operational amplifier to the gate thereof, whereby the potential of the constant-voltage output line is controlled to be a constant voltage at the second potential.

The plurality of constant-voltage control transistors are formed to have different threshold voltages and are selected for use.

The constant-voltage generation circuit makes it possible to select arid output a constant voltage of a value that corresponds to the constant-voltage control transistor to be selected. The optimum constant-voltage control transistor could be selected by measuring the value of the constant voltage obtained when each of a group of transistors formed on an IC chip is selected in sequence, by way of example. This makes it possible to obtain a constant-voltage generation circuit that outputs the optimum constant voltage, without being affected by variations in fabrication conditions.

The constant-voltage generation circuit comprises:

a selection circuit for selecting one transistor from a plurality of constant-voltage control transistors.

The constant-voltage generation circuit is preferably connected to a monitor terminal and is also provided on the same substrate as a test circuit. This test circuit is used during the inspection process to select each of the constant-voltage control transistors and measure the output voltage of that transistor through the monitor terminal. One transistor is specified from this plurality of transistors, based on these measurement results, and the selection circuit selects that transistor.

In this manner, when a transistor is selected from the group of transistors formed on the IC chip, the value of the constant voltage to be generated can be measured from the monitor terminal. This makes it possible to obtain a constant-voltage generation circuit that outputs the optimum constant voltage, regardless of IC fabrication conditions.

This test circuit is preferably formed in such a manner that it is connected to a test pad. Each of the constant-voltage control transistors is selected through the test circuit by controlling the voltage applied to the test pad.

This makes it possible to use the test circuit to shape a signal for selecting each of the constant-voltage control transistors, and measure the comparison voltage that is output by each transistor.

The selection circuit comprises a plurality of unit circuits which are formed in correspondence to the plurality of constant-voltage control transistors and which are connected to a plurality of pads.

Each of this plurality of unit circuits comprises one fuse, non-volatile memory, or memory element, and a transistor is selected by applying a voltage to the corresponding pad.

This constant-voltage generation circuit makes it possible to configure a selection circuit for selecting the oscillation-inducing signal inversion amplifier easily, by the addition of one of a fuse, non-volatile memory, or memory element.

The constant-voltage generation circuit is preferably formed in such a manner that an output constant voltage is supplied to the oscillation circuit. This makes it possible to adjust the constant voltage to match the oscillation characteristic of the oscillation circuit, thus making it possible to supply the optimum constant voltage to the oscillation circuit.

A semiconductor device, portable electronic equipment, timepiece, or the like that comprises the above oscillation circuit and constant-voltage generation circuit may be formed.

The description now turns to specific examples of the second embodiment. Note that components corresponding to those in previously described circuits are denoted by the same reference numbers and further description thereof is omitted.

EXAMPLE 1

Figure 18:
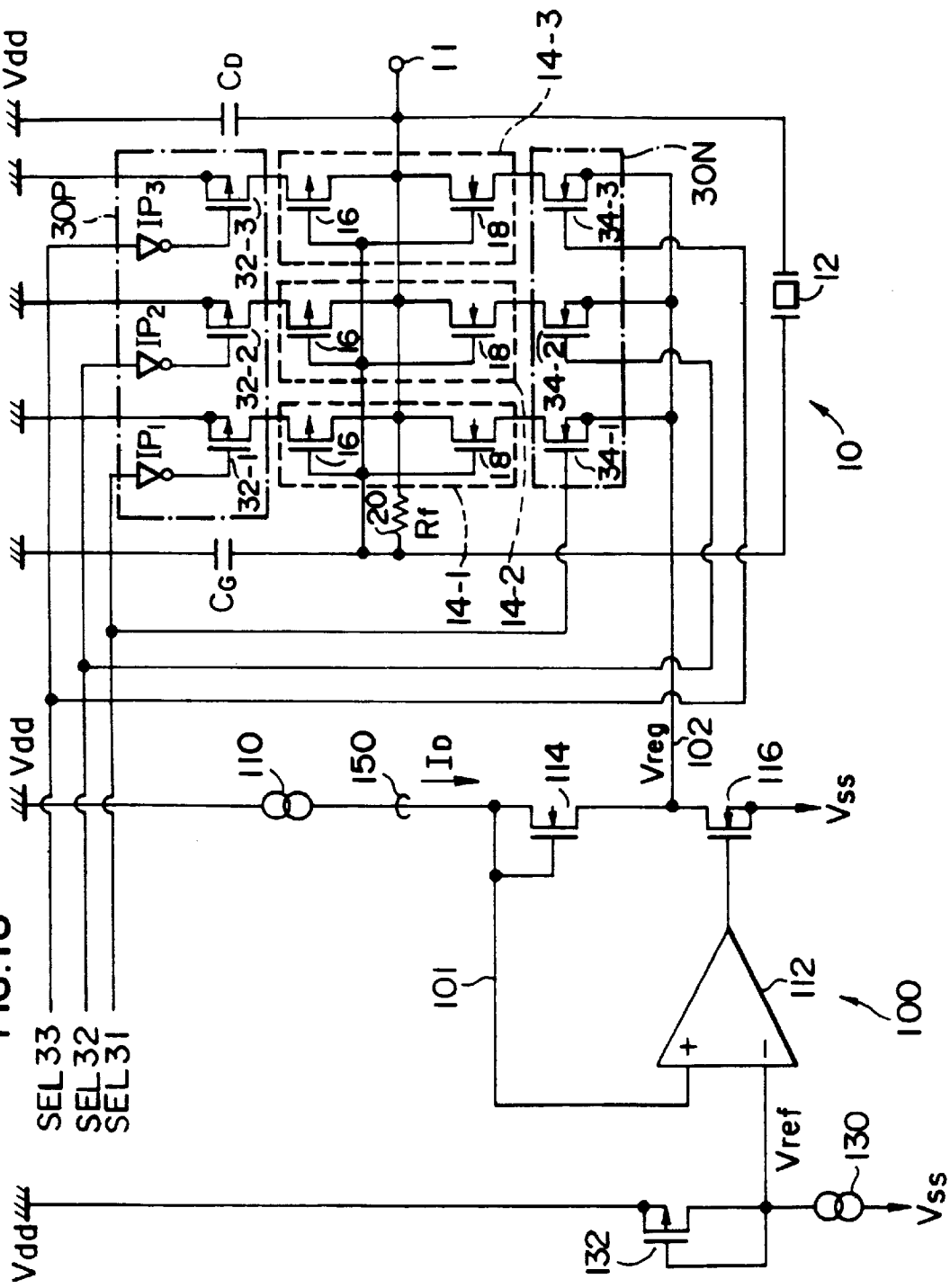
FIG. 18 is an explanatory view of the crystal oscillation circuit of this second embodiment.

A first example of an electronic circuit comprising the constant-voltage generation circuit 100 that generates a predetermined constant voltage $V_{reg}$ and the crystal oscillation circuit 10 that is driven by this constant voltage $V_{reg}$ is shown in FIG. 18.

This constant-voltage generation circuit 100 comprises an FET 132 and a constant-current power source 130 that are connected in series between a ground potential $V_{dd}$ side and a power source $V_{ss}$ side, with the configuration being such that the reference voltage $V_{ref}$ is output to the negative terminal of the operational amplifier 112. Note that the rest of the configuration is the same as that of the previously described constant-voltage generation circuit 100, and thus similar components are denoted by the same reference numbers and further description thereof is omitted.

The constant-voltage generation circuit 100 outputs the constant voltage $V_{reg}$ through the output line 102 to the crystal oscillation circuit 10.

This the crystal oscillation circuit 10 comprises a plurality of signal inversion amplifiers 14-1, 14-2, and 14-3 that can be selected for use. The threshold voltages of PMOSFETs 16 and NMOSFETs 18 of these signal inversion amplifiers 14-1, 14-2, and 14-3 are set to be different for each of the signal inversion amplifiers 14-1, 14-2, and 14-3.

In this case, assume that the threshold voltages of the FETs 18 of the signal inversion amplifiers 14-1, 14-2, and 14-3 are $V_{thn}1$, $V_{thn}2$, and $V_{thn}3$, respectively, and the threshold voltages of the FETs 16 thereof are $V_{thp}1$, $V_{thp}2$, and $V_{thp}3$, respectively. The threshold voltages of these FETs 16 and 18 are set to satisfy the following inequalities:

$$V_{thn}1 > V_{thn}2 > V_{thn}3 |V_{thp}1| > |V_{thp}2| > |V_{thp}3|$$

The threshold voltages of these transistors 16 and 18 are set by controlling the concentration with which impurities are implanted during the fabrication of the transistors. In this case, the threshold voltages of the FETs 16 are formed to have differences on the order of 0.1 volts. Similarly, the absolute values of the threshold voltages of the FETs 18 are formed to have differences on the order of 0.1 volts.

This crystal oscillation circuit 10 comprises a first selection circuit 30P and a second selection circuit 30N, with the configuration being such that the signal inversion amplifier 14 that uses the FETs 16 and 18 with the optimum threshold voltages is selected from the plurality of signal inversion amplifiers 14-1, 14-2, and 14-3.

The first selection circuit 30P comprises a plurality of PMOSFETs 32-1, 32-2, and 32-3 provided between the signal inversion amplifiers 14-1, 14-2, and 14-3 and the ground potential $V_{dd}$, together with a plurality of signal inversion amplifiers $IP_1$, $IP_2$, and $IP_3$ that invert the selection signals SEL31, SEL32, and SEL33 for input to the gates of these FETs 32-1, 32-2, and 32-3.

The second selection circuit 30N comprises a plurality of NMOSFETs 34-1, 34-2, and 34-3 provided between the signal inversion amplifiers 14-1, 14-2, and 14-3 and the line 102 supplying the constant voltage $V_{reg}$, where these selection signals SEL31, SEL32, and SEL33 are input directly to the gates of these FETs 34-1, 34-2, and 34-3.

Therefore, by making one of these selection signals SEL31, SEL32, and SEL33 go high and the others low, the FETs 32 and 34 corresponding to the high-level selection signal can be driven to turn on, so that the signal inversion amplifier 14 connected in series thereto is selected. The configuration is such that the signal inversion amplifier 14-1 is selected by setting SEL31 to high and SEL32 and SEL33 to low, for example, the signal inversion amplifier 14-2 is selected by setting SEL32 to high and SEL31 and SEL33 to low, and the signal inversion amplifier 14-3 is selected by setting SEL33 to high and SEL31 and SEL32 to low.

This configuration makes it possible to select and use the signal inversion amplifier 14 comprising the FETs 16 and 18 that have the optimum threshold voltages, from amongst the three signal inversion amplifiers 14-1, 14-2, and 14-3.

Figure 19:
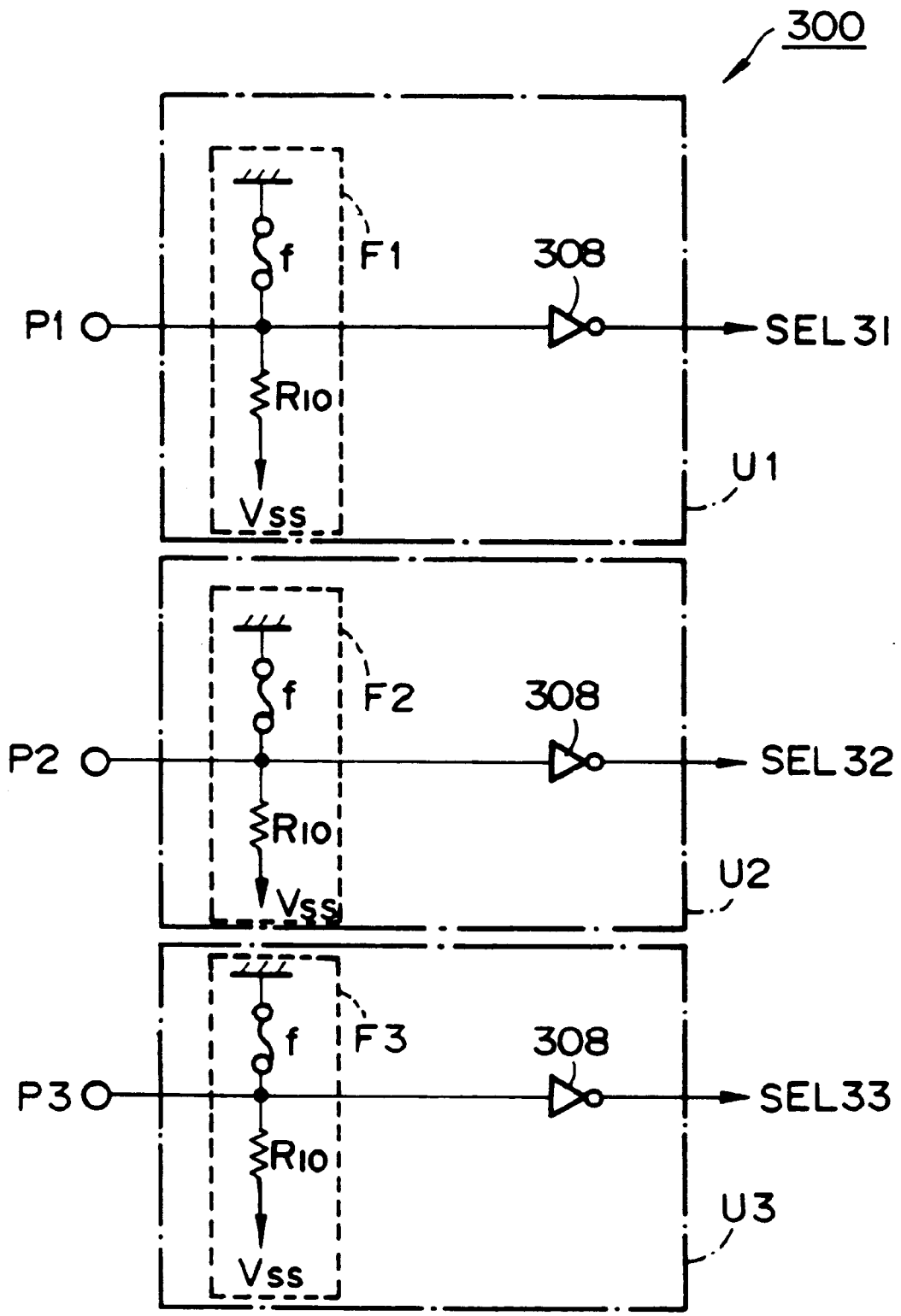
FIG. 19 is a schematic explanatory view of a switching circuit.

An example of the switching circuit 300 that outputs the selection signals SEL31, SEL32, and SEL33 is shown in FIG. 19. This switching circuit 300 comprises a plurality of unit circuits U1, U2, and U3 for outputting the selection signals SEL31, SEL32, and SEL33.

Each of these unit circuits U1, U2, and U3 comprises corresponding input pads P1, P2, and P3, with the configuration being such that signals from the outside are input thereto through those pads P1, P2, and P3.

Each of the unit circuits U1, U2, and U3 has a fuse f and a resistor $R_{10}$ connected in series between the ground potential $V_{dd}$ side and the power source potential $V_{ss}$ side. The pads P1, P2, and P3 are connected to the connection point of the corresponding fuse f and resistor $R_{10}$, and also to an input terminal of a signal inversion amplifier 308. Thus the selection signals SEL31, SEL32, and SEL33 are output from the signal inversion amplifiers 308 comprised within the unit circuits U1, U2, and U3.

In this case, the resistance of each of the fuses f is set to be sufficiently smaller than the resistance of the resistance $R_{10}$.

In this example, the selection signals SEL10, SEL20, and SEL30 that are output from the unit circuits U1, U2, and U3 function to control the turning on and off of the corresponding FETs 32 and 34. These selection signals SEL10, SEL20, and SEL30 are used to select the optimum signal inversion amplifier 14 from amongst the plurality of signal inversion amplifiers 14-1, 14-2, and 14-3.

The selection of the signal inversion amplifier 14 is done by cutting one of the fuses of the unit circuits U1, U2, and U3. This cutting of a fuse f of the unit circuits U1, U2, and U3 is done by selectively applying a high voltage on the order of 20 volts to the pads P1, P2, and P3.

For example, a high voltage applied to the pad P1 will cut the fuse f of the unit circuit U1. Subsequently, the potential of the pad P1 is made to be $V_{ss}$ through the resistor $R_{10}$, by stopping the application of the high voltage to the pad P1.

The description above concerned the selection of a signal inversion amplifier 14 by selectively cutting the fuses f of the unit circuits U1, U2, and U3, but other methods can be used therefore, such as a configuration in which information on the signal inversion amplifier 14 to be selected is stored in non-volatile memory or a memory element.

Figure 20:
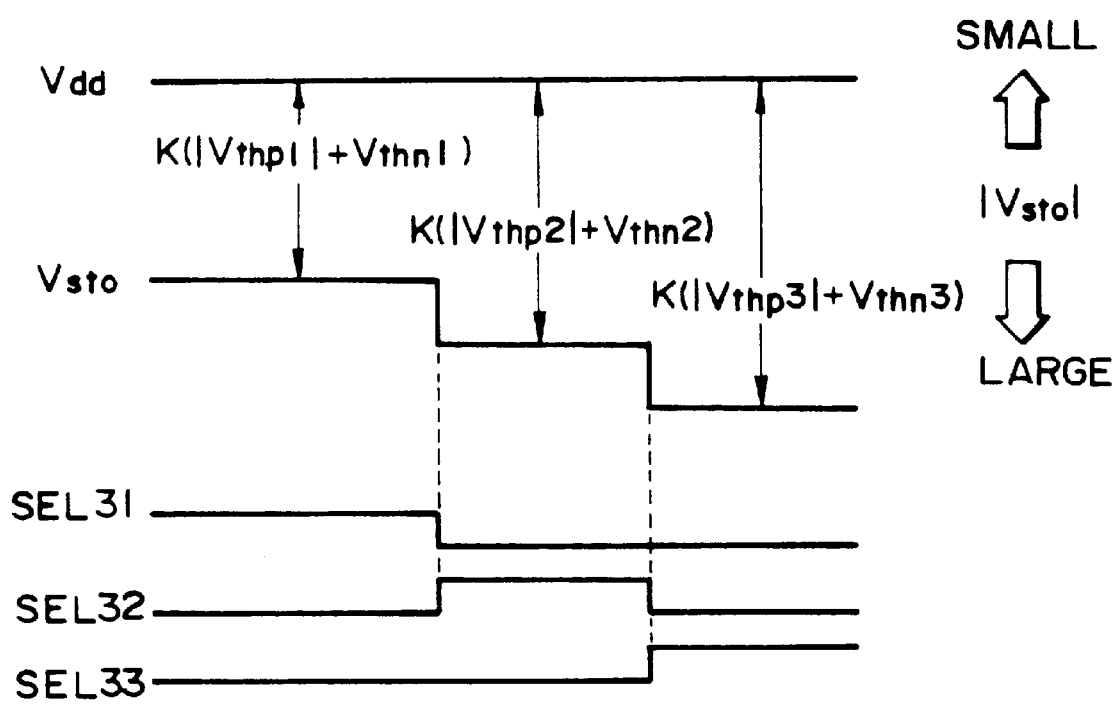
FIG. 20 is a timing chart of the relationship between the oscillation-stopped voltage and selection signals.

A timing chart of the relationship between the oscillation-stopped voltage $V_{sto}$ and the selection signals SEL31 to SEL33 is shown in FIG. 20. In FIG. 20 time is plotted along the horizontal axis.

First of all, if the selection signal SEL31 is high, the oscillation-stopped voltage $|V_{sto}|$ is given by: $K(|V_{thp}1|+V_{thn}1)$ (K: constant). If the selection signal SEL31 is low and the selection signal SEL32 is high, the oscillation-stopped voltage $|V_{sto}|$ is given by: $K(|V_{thp}2|+V_{thn}2)$. If the selection signal SEL32 is low and the selection signal SEL33 is high, the oscillation-stopped voltage $|V_{sto}|$ is given by: $K(|V_{thp}3|+V_{thn}3)$. That is to say, the oscillation-stopped voltage $|V_{sto}|$ is at a minimum when SEL31 is high and the oscillation-stopped voltage $|V_{sto}|$ is at a maximum when SEL33 is high.

The description now turns to the procedure for selecting the signal inversion amplifiers 14-1, 14-2, and 14-3.

The cutting of the fuse f of one of the unit circuits U1 to U3 is done when the IC is being tested.

First of all, the value of the constant voltage $V_{reg}$ that is output from the constant-voltage generation circuit 100 is measured and the short-circuit current $I_s$ flowing through each of the signal inversion amplifiers 14-1 to 14-3 is measured, and one of these signal inversion amplifiers 14 is selected on the basis of these measurement results.

The measurement of the short-circuit current $I_s$ flowing through each signal inversion amplifier 14 is done by connecting the signal inversion amplifier 14 as shown in FIG. 5. During this time, the relationship between the oscillation-stopped voltage $|V_{sto}|$ and the short-circuit current $I_s$ is obtained as shown in FIG. 6. Note that details of this procedure have already been given, so further description thereof is omitted.

As previously stated, the relationship between the oscillation-stopped voltage $|V_{sto}|$ and the short-circuit current $I_s$ of the signal inversion amplifier 14 shown in FIG. 6 must be such that the condition $|V_{reg}|>|V_{sto}|$ is satisfied and $|V_{reg}|$ must also be as small as possible, to reduce the power consumption of the crystal oscillation circuit 10.

In other words, to achieve a lower power consumption, it is necessary that the short-circuit current $I_s$ and the oscillation-stopped voltage $|V_{sto}|$ lie within the range of the region 1 in FIG. 6. To select an oscillation-inducing signal inversion amplifier 14 that can cope with recent trends towards constant-voltage power supplies, while satisfying these conditions, it is necessary to select the oscillation-inducing signal inversion amplifier 14 which oscillates stably in a range in which the on/off operation of the transistors is guaranteed and which also has a lower short-circuit current $I_s$.

This means that a lower power consumption for the crystal oscillation circuit 10 can be implemented by selecting the optimum oscillation-inducing signal Inversion amplifier 14 for satisfying these conditions, based on the above measurements of the short-circuit current $I_s$.

The short-circuit current $I_s$ of each of the oscillation-inducing signal inversion amplifiers 14-1 to 14-3 can be measured by using the test circuit and the test pad connected to that test circuit (not shown in the figure), during the IC inspection process before the crystal oscillator 12 is mounted on the substrate. This specifies the signal inversion amplifier 14 having the lowest short-circuit current $I_s$ that is capable of guaranteeing the on/off operation. This IC test is performed with the circuitry still in the wafer state. In other words, the short-circuit current $I_s$ is measured for each of the IC chips, using the test circuit and test pad provided within each IC chip. During this testing, only the oscillation-inducing signal inversion amplifiers 14-1 to 14-3 and the selection circuits 30P and 30N are active; the other components are in a non-active state.

Either one or a plurality of test pads are provided, depending on the number of oscillation-inducing signal inversion amplifiers 14 and the logic of the test circuit. The test circuit comprises a logic circuit that sets any of the selection signals SEL31 to SEL33 to high, by a combination of voltage levels input to the test pad. The measurement of the short-circuit current $I_s$ is done by using the test circuit in a state in which simulations of these high-level selection signals are selectively input to the oscillation-inducing signal inversion amplifiers 14-1 to 14-3. During this time, the monitor pad MP connected to the output line 102 is used to apply a negative voltage $V_{reg}$, which could be the same as the constant voltage, After the measurement of the short-circuit currents $I_s$, the optimum oscillation-inducing signal inversion amplifier of the oscillation-inducing signal inversion amplifiers 14-1 to 14-3 is selected. The fuse f of the unit circuit U corresponding to the thus-specified oscillation-inducing signal inversion amplifier 14 is then cut, to select that one optimum oscillation-inducing signal inversion amplifier 14.

As mentioned previously, the short-circuit currents $I_s$ of the oscillation-inducing signal inversion amplifiers 14 of the crystal oscillation circuit 10 of this example can be measured during the IC testing procedure. This means that an oscillation circuit 10 using the optimum oscillation-inducing signal inversion amplifier 14 can be obtained, regardless of fabrication conditions, thus enabling an increase in the yield of completed devices.

Since the crystal oscillation circuit 10 of this example operates with the optimum oscillation-inducing signal inversion amplifier 14, this makes it possible to implement a lower power consumption with a good output characteristic.

Note that the description of this example related to three types of oscillation-inducing signal inversion amplifier 14 having different threshold voltages, but two amplifiers could be used therein, or four or more amplifiers.

EXAMPLE 2

Figure 21:
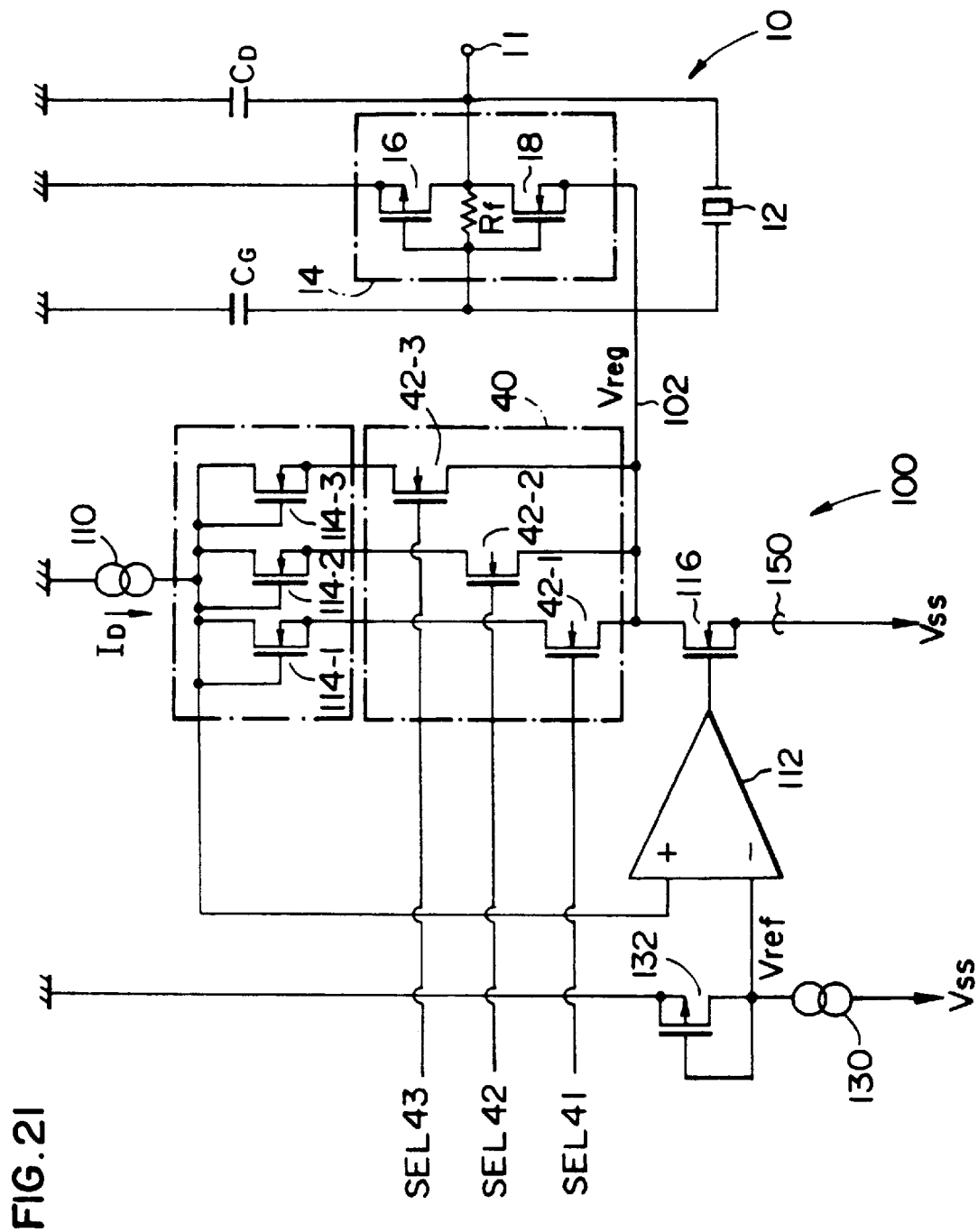
FIG. 21 is an explanatory view of the constant-voltage generation circuit of the second embodiment.

A second example of the constant-voltage generation circuit 100 for generating the constant voltage $V_{reg}$ is shown in FIG. 21.

This constant-voltage generation circuit 100 comprises a plurality of controlling NMOSFETs 114-1, 114-2, and 114-3 with different threshold voltages, and a third selection circuit 40 for selecting any desired FET from among this plurality of FETs 114-1, 114-2, and 114-3.

If the threshold voltages of these control FETs 114-1, 114-2, and 114-3 are assumed to be $V_{thn}11$, $V_{thn}12$ and $V_{thn}13$, they are shaped in such a manner that the following relationship exists between them:

$$V_{thn}11 > V_{thn}12 > V_{thn}13$$

These threshold voltages can be set by controlling the concentration of impurities implanted during the formation of the transistors. During this time, each potential difference between $V_{thn}11$ and $V_{thn}12$ and between $V_{thn}12$ and $V_{thn}13$ could be set on the order of 0.1 V, for example.

The third selection circuit 40 comprises a plurality of FETs 42-1, 42-2, and 42-3 connected in series with the FETs 114-1, 114-2, and 114-3 to function as switching elements, and selection signals SEL41, SEL42, and SEL43 are input to the gates of the FETs 42-1, 42-2, and 42-3.

The constant-voltage generation circuit 100 uses the selection signals SEL41, SEL42, and SEL43 to turn the switching FETs 42-1, 42-2, and 42-3 selectively on, to select any desired control FET 114. Since the threshold voltages of the control FETs 114-1, 114-2, and 114-3 are different, as mentioned previously, the value of the constant voltage $V_{reg}$ can be controlled to a potential corresponding to the selected control FET 114.

Figure 22:
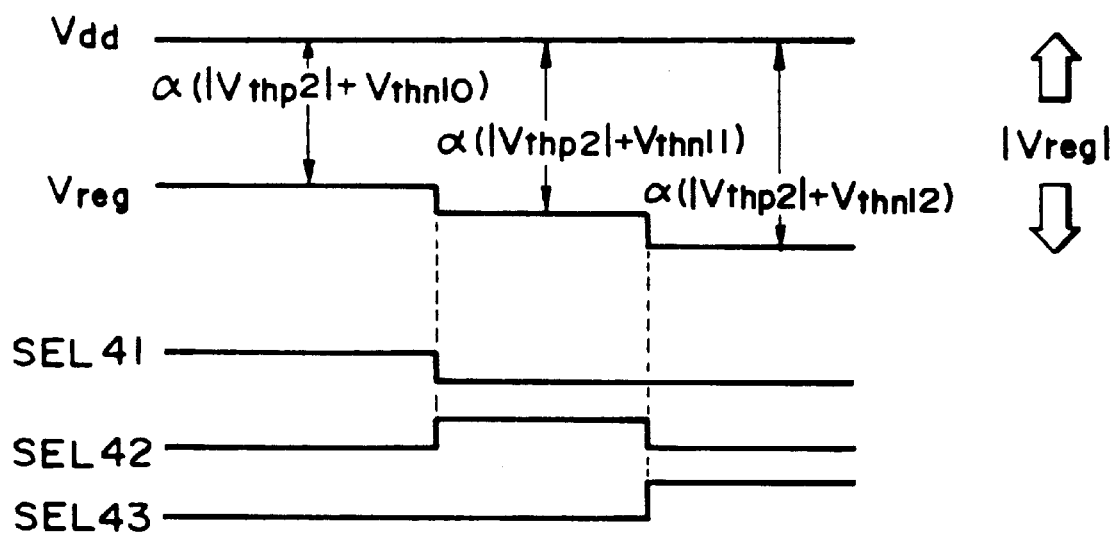
FIG. 22 is an explanatory view of constant-voltage control using selection signals.

A timing chart of this constant-voltage generation circuit 100 is shown in FIG. 22. In this case, if it is assumed that the threshold voltages of the FETs 114 and 132 are $V_{thn}$ and $V_{thp}0$, respectively, the constant voltage $V_{reg}$ that is output from the constant-voltage generation circuit 100 can be expressed as:

$$|V_{reg}| = \alpha(|V_{thp}0| + V_{thn})$$

Therefore, if the selection signal SEL41 is set high to select the FET 114-1, the value of the constant voltage is given by: $|V_{reg}| = \alpha(|V_{thp}0| + V_{thn}1)$. If the selection signal SEL41 is set low and the selection signal SEL42 is set high, $|V_{reg}| = \alpha(|V_{thp}0| + V_{thn}2)$. If the selection signal SEL41 is set low and the selection signal SEL43 is set high, $|V_{reg}| = \alpha(|V_{thp}0| + V_{thn}3)$.

In other words, the constant voltage $|V_{reg}|$ is lowest when SEL41 is high, and highest when SEL43 is high level.

Note that a circuit similar to that shown in FIG. 19 is used as the circuit for generating these selection signals SEL41 to SEL43, so further description thereof is omitted.

The setting of the constant voltage $V_{reg}$ that is output from the constant-voltage generation circuit 100 is done in a manner similar to that in the previously described examples, so the conditions described below must be satisfied.

Note that the procedure for selecting the FET 114 that satisfies these conditions is similar to that for selecting the desired signal inversion amplifier 14 by the circuit of FIG. 18.

First of all, the voltage level applied to the test pads connected to the test circuit is controlled to set the level of each of the selection signals SEL41, SEL42, and SEL43 successively to high, The value of the constant voltage $V_{reg}$ that is output from the output line 102 is then varied by turning the constant-voltage control FETs 114-1, 114-2, and 114-3 on in sequence. The value of the constant voltage $V_{reg}$ output from the output line 102 is measured through the monitor pad MP connected to the line 102.

This IC test is performed with the circuitry still in the wafer state. The constant voltage $V_{reg}$ is measured for each of the IC chips, using the test circuit, test pad, and monitor pad provided within each IC chip. Note that, during this testing, only the control FETs 114-1, 114-2, and 114-3 and the third selection circuit 40 are active; the other components are in a non-active state.

The constant voltage $V_{reg}$ that is output during this time must satisfy the condition $|V_{reg}| > |V_{sto}|$, and the value of $|V_{reg}|$ must also be as small as possible from the viewpoint of reducing power consumption.

Therefore, the short-circuit current $I_s$ of the oscillation-inducing signal inversion amplifier 14 of the crystal oscillation circuit 10 is measured and the optimum constant voltage $V_{reg}$ that satisfies these relationships is specified, as described above with respect to Example 1. The fuse f of the unit circuit U connected to the NMOSFET 114 that is necessary for generating the thus-specified constant voltage $V_{reg}$ is then cut. Thus the optimum constant-voltage control NMOSFET 114 is selected.

Note that the description of this example related to three different constant-voltage control FETs 114 having different threshold voltages, but the configuration could be such that four or more FETs 114 are provided and one of these FETs is selected, for example.

Figure 17:
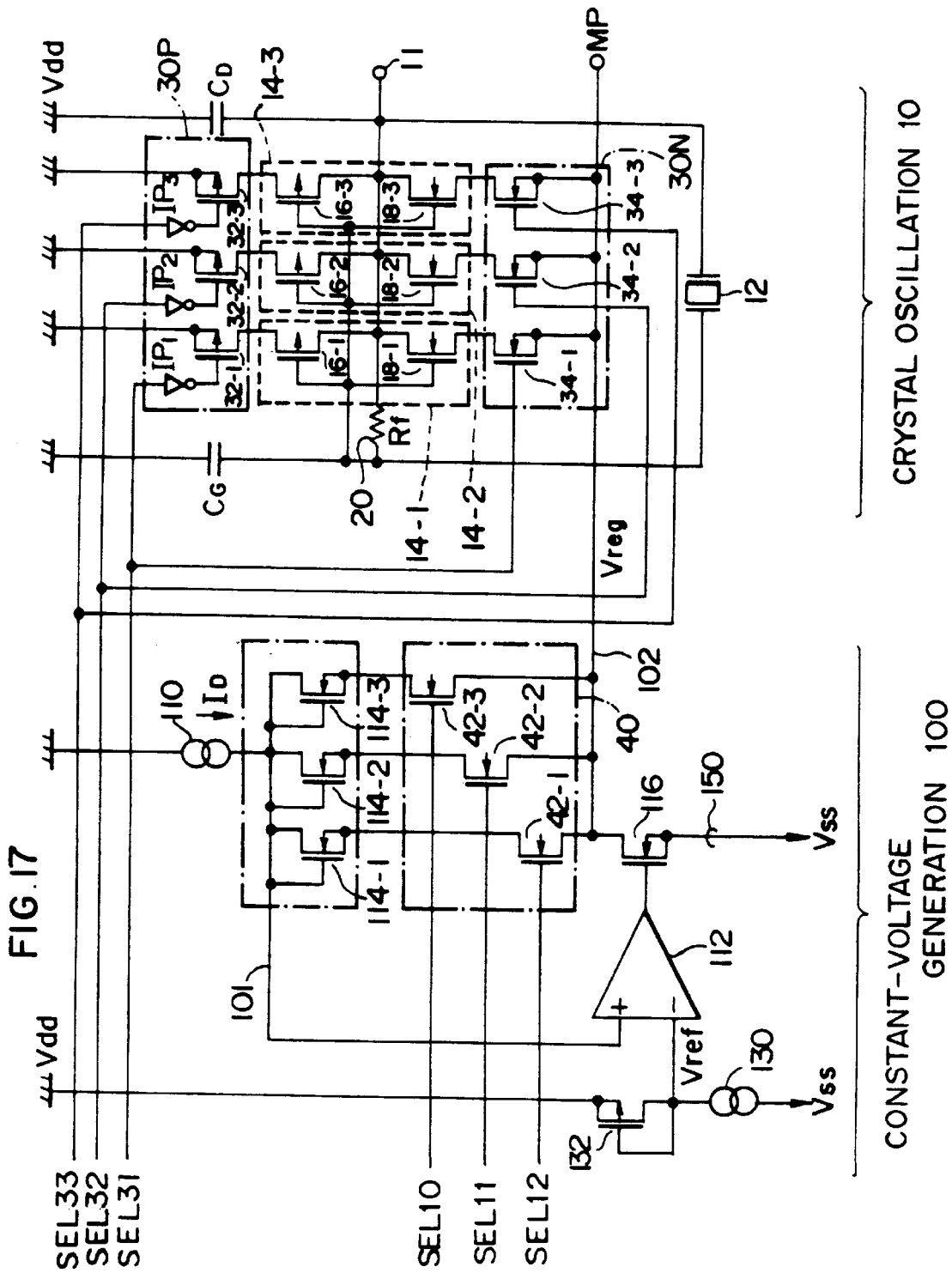
FIG. 17 is an explanatory view of electronic circuitry comprising a constant-voltage generation circuit and crystal oscillation circuit in accordance with a second embodiment.

In addition, a lower power consumption could be provided by forming an electronic circuit of a combination of the constant-voltage generation circuit 100 of Example 2 and the crystal oscillation circuit 10 of Example 1 simultaneously, as shown in FIG. 17.

In such a case, both of the first selection circuit 30P that shapes the selection signals SEL31 to SEL33 and the second selection circuit 30N that shapes the selection signals SEL31 to SEL33 are necessary, but the monitor pad can be used in common. The circuit configuration of the first selection circuit and the second selection circuit could be the same, as previously described. Note that if the circuitry is configured as shown in FIG. 17, an optimum combination of a signal inversion amplifier 14 and a control FET 114 can be selected from the results of measuring the short-circuit current of the oscillation-inducing signal inversion amplifier 14 of the crystal oscillation circuit 10 and the results of measuring the constant voltage $V_{reg}$. This makes it possible to design an even lower power consumption, while ensuring a more stable oscillation characteristic.

Note that the constant-voltage generation circuit 100 and the crystal oscillation circuit 10 of the second embodiment could also be used in the circuits of FIGS. 12 and 13 relating to the first embodiment.

3. Third Embodiment

The description now turns to a third embodiment of this invention.

An oscillation circuit in accordance with this embodiment comprises: a first oscillation-inducing signal inversion amplifier comprising at least one transistor having a first threshold voltage; a second oscillation-inducing signal inversion amplifier comprising at least one transistor having a second threshold voltage that differs from the first threshold voltage; and a feedback circuit having a crystal oscillator connected to an output side and an input side of the first and second oscillation-inducing signal inversion amplifiers, for inverting the phase of an output signal of the first and second oscillation-inducing signal inversion amplifiers to feed back as an input to the oscillation-inducing signal inversion amplifier.

This oscillation circuit oscillates in accordance with the first oscillation-inducing signal inversion amplifier during a first time period, and oscillates in accordance with the second oscillation-inducing signal inversion amplifier during a second time period.

The above configuration makes it possible for the oscillation circuit to use oscillation-inducing signal inversion amplifiers having different driving capabilities during the first and second time periods. This means that the energy stored in the crystal oscillator in the feedback circuit can be used efficiently, enabling oscillation that is stable and consumes less power, without increasing the scale of the circuitry.

The absolute value of the first threshold voltage is preferably set to be lower than the absolute value of the second threshold voltage.

Impurity implantation makes it possible to increase the driving capability of the first oscillation-inducing signal inversion amplifier by lowering the absolute value of the first threshold voltage, and decrease the driving capability of the second oscillation-inducing signal inversion amplifier by increasing the absolute value of the second threshold voltage.

The first oscillation-inducing signal inversion amplifier and the second oscillation-inducing signal inversion amplifier are preferably formed to comprise a transistor of a first conductivity type and a transistor of a second conductivity type.

This makes it possible to configure the oscillation-inducing signal inversion amplifiers of CMOSFET technology, and thus obtain an oscillation circuit that oscillates at a low power consumption and with good characteristics.

Assume that this first time period is the period from power-on until oscillation is stable and the second time period is the period from stable oscillation until oscillation ends.

With this oscillation circuit, it is possible to use oscillation-inducing signal inversion amplifiers having different driving capabilities during a time period from when power is applied until the oscillation stabilizes and a time period from when the oscillation has stabilized until oscillation ends. This enables efficient usage of the energy stored in the crystal oscillator, to reduce the power consumption.

This oscillation circuit preferably comprises an oscillation-inducing signal inversion amplifier switching circuit; and the oscillation-inducing signal inversion amplifier switching circuit is preferably formed in such a manner that it detects a time period from when power is applied until the oscillation stabilizes and selects the first oscillation-inducing signal inversion amplifier therefore, then selects the second oscillation-inducing signal inversion amplifier for the time period from when the oscillation has stabilized until oscillation ends.

The provision of the oscillation-inducing signal inversion amplifier switching circuit within this oscillation circuit ensures that the first oscillation-inducing signal inversion amplifier, which has a large driving capability, operates during the time period from when power is applied until the oscillation stabilizes, then the second oscillation-inducing signal inversion amplifier, which has a lower driving capability, operates during the time period from when the oscillation has stabilized until oscillation ends, to reduce the power consumption.

This oscillation-inducing signal inversion amplifier switching circuit preferably comprises: a power-on detection circuit for detecting the application of power to the oscillation circuit; and a timer for measuring the elapsed time since the power was applied, to detect a switching point from the first time period to the second time period; whereby the first oscillation-inducing signal inversion amplifier is selected at the point at which power is applied; and the second oscillation-inducing signal inversion amplifier is selected at the point at which the timer has detected that the first time period has switched to the second time period.

Note that the configuration could be such that, instead of using this timer, a time constant of the power-on detection circuit is adjusted and a detection signal is output from the power-on detection circuit at a switching point between the first time period and the second time period.

It is preferable to form an electronic circuit, semiconductor device, electronic equipment, timepiece, or the like that comprises the above oscillation circuit.

Example

Figure 23:
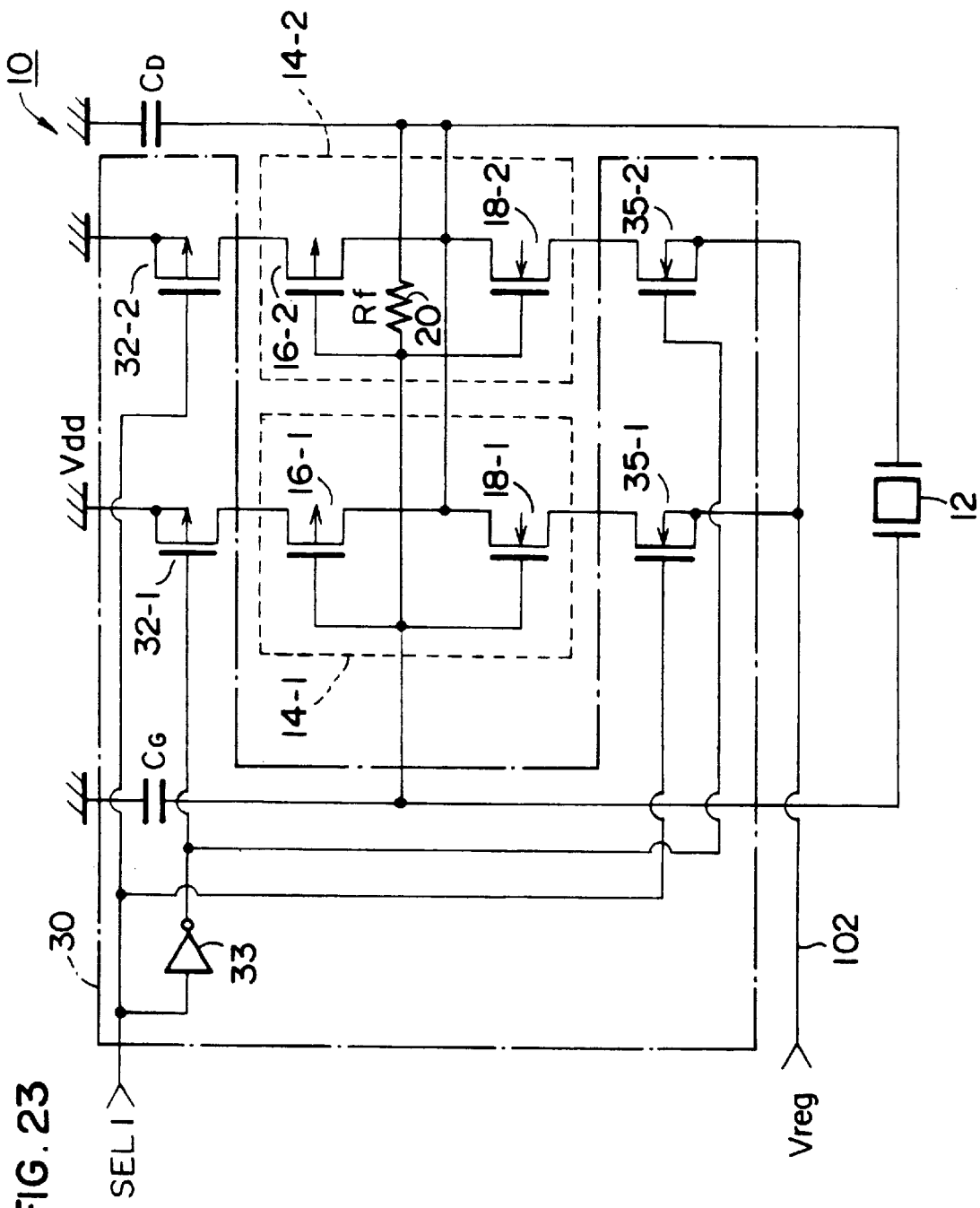
FIG. 23 is an explanatory view of the crystal oscillation circuit of a third embodiment.

An example of the crystal oscillation circuit of this third embodiment is shown in FIG. 23.

Note that components of the crystal oscillation circuit of this example that correspond to those in the previously described circuits are denoted by the same reference numbers and further description thereof is omitted The crystal oscillation circuit 10 of this example comprises a plurality of signal inversion amplifiers 14-1 and 14-2 and a selection circuit 30 that selects and sets to a usable state one of the signal inversion amplifiers 14, on the basis of a selection signal SEL1.

Each of the signal inversion amplifiers 14-1 and 14-2 comprises a PMOSFET 16-1 or 16-2 and an NMOSFET 18-1 or 18-2.

This example is characterized in that the absolute values of the threshold voltages of the FETs 16-1 and 18-1 configuring the first signal inversion amplifier 14-1 are formed to be less than the absolute values of the threshold voltage of the FETS 16-2 and 18-2 configuring the second signal inversion amplifier 14-2. More specifically, the difference in absolute values of the threshold voltages of the FETs 16-1 and 16-2 is on the order of 0.1 to 0.3 V and the difference in absolute values of the threshold voltages of the FETs 18-1 and 18-2 is similarly on the order of 0.1 to 0.3 V.

Therefore, the signal inversion amplifier 14-1 has a characteristic such that it has a high driving capability for the oscillation circuit 10 but the power consumption is large, and the signal inversion amplifier 14-2 has a characteristic such that the driving capability thereof is low but the power consumption is small.

The two ends of the first and second signal inversion amplifiers 14-1 and 14-2 are each connected between the ground potential $V_{dd}$ side and the line 102 side, and they are driven by a voltage that is the potential difference between $V_{dd}$ and $V_{reg}$.

The selection circuit 30 comprises switching elements connected in series to the power supply lines of these first and second signal inversion amplifiers 14-1 and 14-2. More specifically, a control FET 32-1 is connected in series to the power supply line on the $V_{dd}$ side of the first signal inversion amplifier 14-1 and a control FET 35-1 is connected in series to the power supply line on the potential $V_{reg}$ side thereof. Similarly, a control FET 32-2 is connected in series to the power supply line on the $V_{dd}$ side of the second signal inversion amplifier 14-2 and a control FET 35-2 is connected in series to the power supply line on the $V_{reg}$ side thereof.

The selection signal SEL1 is input directly to the gates of the control FETs 32-2 and 35-1. This selection signal SEL1 is also input through a signal inversion amplifier 33 to the gates of the control FETs 32-1 and 35-2.

Therefore, either one group of control FETs 32-2 and 35-2 or the other group of control FETs 32-1 and 35-1 can be turned selectively on or off by switching the level of the selection signal SEL1, so that power is supplied to only one of the signal inversion amplifiers 14.

In this example, the selection signal SEL1 is generated by using the previously described circuit shown in FIG. 2A. This selection signal SEL1 is output from the switching circuit 300 in accordance with the timing chart of FIG. 2B.

When power is applied to the crystal oscillation circuit 10, therefore, the control FETs 32-1 and 35-1 are turned on and the oscillation circuit 10 is activated by using the first signal inversion amplifier 14-1. In this case, the first signal inversion amplifier 14-1 is configured of FETs 16-1 and 18-1 having low threshold voltages, so that the oscillation thereof has a high driving capability and it rapidly rises to a stable oscillation state.

After oscillation has stabilized, the control FETs 32-2 and 35-2 are turned on by the selection signal SEL1, so that the second signal inversion amplifier 14-2 operates instead of the first signal inversion amplifier 14-1.

The FETs 16-2 and 18-2 of the second signal inversion amplifier 14-2 have high threshold voltages, so that they can maintain the stabilized oscillation state at a low power consumption.

With this configuration, this example makes it possible to simultaneously solve the two technical concerns of a reliable start of oscillation and a reduced power consumption, by dividing the use of the signal inversion amplifier 14-1 having a high driving capability and the signal inversion amplifier 14-2 having a low driving capability between the period from the start of oscillation of the oscillation circuit 10 until stable oscillation starts and the period from when the oscillation has stabilized until the oscillation ends.

Furthermore, the crystal oscillation circuit 10 of this example could also be used as the crystal oscillation circuit 10 shown in FIG. 12 or FIG. 13, by way of example.

We claim:

1. An oscillation circuit comprising:
a signal inversion amplifier comprising a first transistor and a second transistor;
a feedback circuit having a crystal oscillator, for inverting the phase of an output signal of said signal inversion amplifier and feeding said inverted signal back as an input to said signal amplifier; and
a control circuit for controlling a back gate voltage between the back gate and source of said second transistor;
wherein the back gate of said second transistor is set to a predetermined potential; and
wherein said control circuit comprises:
a rectifier element circuit connected to the source of said second transistor;
a switching element that forms a bypass circuit for said rectifier element circuit; and
a switching circuit for selectively switching a back gate voltage of said second transistor over at least two stages, by on/off control of said switching element.

2. An oscillation circuit comprising:
a signal inversion amplifier comprising a first transistor and a second transistor;
a feedback circuit having a crystal oscillator, for inverting the phase of an output signal of said signal inversion amplifier and feeding said inverted signal back as an input to said signal amplifier; and
a control circuit for controlling a back gate voltage between the back gate and source of said second transistor;
wherein the source of said second transistor is set to a predetermined potential; and
wherein said control circuit comprises;
a rectifier element circuit connected to the back gate of said second transistor;
a switching element that forms a bypass circuit for said rectifier element circuit; and
a switching circuit for selectively switching a back gate voltage of said second transistor over at least two stages, by outputting on/off control signals of said switching element.

3. The oscillation circuit as defined in claim 1, wherein said rectifier element circuit comprises a plurality of rectifier elements connected in the forward direction in series; and wherein said switching element forms a bypass circuit for at least one rectifier element among said plurality of rectifier elements.

4. The oscillation circuit as defined in claim 1, wherein said control circuit controls a back gate voltage of said second transistor to have different values during a first time period for activating said oscillation circuit and a second time period during which said oscillation circuit oscillates stably.

5. The oscillation circuit as defined in claim 1, wherein said switching circuit comprises:

operating time period detection means for detecting a period from power-on until a given time has elapsed as a first time period for activating said oscillation circuit, and after said given time period has elapsed, for detecting a second time period during which said oscillation circuit oscillates stably; and means for controlling the switching of said back gate voltage over at least two stages in such a manner that the absolute value of the threshold voltage of said second transistor is small during said first time period and large during said second time period.

6. The oscillation circuit as defined in claim 1, wherein a power supply line of said signal inversion amplifier is connected to a first potential side and a second potential side of potential that differs from said first potential; and wherein said signal inversion amplifier generates an oscillation signal having a potential difference that is between said first potential and said second potential.

7. The oscillation circuit as defined in claim 6, wherein the potential difference between said first potential and said second potential is greater than the absolute value of an oscillation-stopped voltage of said signal inversion amplifier.

8. The oscillation circuit as defined in claim 6, wherein a short-circuit current flowing through said signal inversion amplifier has a value within a range that satisfies a first condition such that the short-circuit current is greater than the ON-state current of a transistor configuring said signal inversion amplifier, whereby said back gate voltage is selected; and wherein a potential difference between the first potential and the second potential is at a minimum voltage within the range for satisfying said first condition.

9. An electronic circuit comprising:

the oscillation circuit as defined in claim 6, and a constant-voltage generation circuit for supplying to said oscillation circuit said second potential with respect to said first potential;

wherein said constant-voltage generation circuit comprises:

a constant-current power source for supplying a constant current, wherein one end of said constant-current power source is connected to said first potential side;

a constant-voltage control transistor formed under the same fabrication conditions as those of said second transistor and also provided in a constant-current path in such a manner that one end of said constant-voltage control transistor is connected to said constant-current power source side and another end of said constant-voltage control transistor is connected to a constant-voltage output line side, for outputting a comparison voltage for generating a constant voltage at said second potential;

an operational amplifier having one terminal to which said comparison voltage is input and another terminal to which a given reference voltage is input; and an output transistor provided in a constant-current path such that one end of said, output transistor is connected to said constant-voltage output line side, the resistance of said output transistor is controlled by inputting an output of said operational amplifier to the gate of said output transistor, whereby the potential of said constant-voltage output line is controlled to be a constant voltage at said second potential.

10. A semiconductor device comprising the oscillation circuit as defined in claim 1.

11. Electronic equipment comprising the oscillation circuit as defined in claim 1, wherein an operating reference signal is shaped from an oscillation output of said oscillation circuit.

12. A timepiece comprising the oscillation circuit as defined in claim 1, wherein a timepiece reference signal is shaped from the oscillation output of said oscillation circuit.

13. The oscillation circuit as defined in claim 2, wherein said rectifier element circuit comprises a plurality of rectifier elements connected in the forward direction in series; and wherein said switching element forms a bypass circuit for at least one rectifier element among said plurality of rectifier elements.

14. The oscillation circuit as defined in claim 2, wherein said control circuit controls a back gate voltage of said second transistor to have different values during a first time period for activating said oscillation circuit and a second time period during which said oscillation circuit oscillates stably.

15. The oscillation circuit as defined in claim 2, wherein said switching circuit comprises:

operating time period detection means for detecting a period from power-on until a given time has elapsed as a first time period for activating said oscillation circuit, and after said given time period has elapsed, for detecting a second time period during which said oscillation circuit oscillates stably; and means for controlling the switching of said back gate voltage over at least two stages in such a manner that the absolute value of the threshold voltage of said second transistor is small during said first time period and large during said second time period.

16. The oscillation circuit as defined in claim 2, wherein a power supply line of said signal inversion amplifier is connected to a first potential side and a second potential side of potential that differs from said first potential; and wherein said signal inversion amplifier generates an oscillation signal having a potential difference that is between said first potential and said second potential.

17. An electronic circuit comprising:

the oscillation circuit as defined in claim 2, and a constant-voltage generation circuit for supplying to said oscillation circuit said second potential with respect to said first potential;

wherein said constant-voltage generation circuit comprises:

a constant-current power source for supplying a constant current, wherein one end of said constant-current power source is connected to said first potential side;

a constant-voltage control transistor formed under the same fabrication conditions as those of said second transistor and also provided in a constant-current path in such a manner that one end of said constant-voltage control transistor is connected to said constant-current power source side and another end of said constant-voltage control transistor is connected to a constant-voltage output line side, for outputting a comparison voltage for generating a constant voltage at said second potential;

an operational amplifier having one terminal to which said comparison voltage is input and another terminal to which a given reference voltage is input; and an output transistor provided in a constant-current path such that one end of said output transistor is connected to said constant-voltage output line side, the resistance of said output transistor is controlled by inputting an output of said operational amplifier to the gate of said output transistor, whereby the potential of said constant-voltage output line is controlled to be a constant voltage at said second potential.

18. A semiconductor device comprising the oscillation circuit as defined in claim 2.

19. Electronic equipment comprising the oscillation circuit as defined in claim 2, wherein an operating reference signal is shaped from an oscillation output of said oscillation circuit.

20. A timepiece comprising the oscillation circuit as defined in claim 2, wherein a timepiece reference signal is shaped from the oscillation output of said oscillation circuit.

21. A semiconductor device comprising the electronic circuit as defined in claim 9.

22. Electronic equipment comprising the electronic circuit as defined in claim 9, wherein an operating reference signal is shaped from an oscillation output of said oscillation circuit.

23. A timepiece comprising the electronic circuit as defined in claim 9, wherein a timepiece reference signal is shaped from the oscillation output of said oscillation circuit.

24. Electronic equipment comprising the semiconductor device as defined in claim 10, wherein an operating reference signal is shaped from an oscillation output of said oscillation circuit.

25. A timepiece comprising the semiconductor device as defined in claim 10, wherein a timepiece reference signal is shaped from the oscillation output of said oscillation circuit.

26. Electronic equipment comprising the semiconductor device as defined in claim 21, wherein an operating reference signal is shaped from an oscillation output of said oscillation circuit.

27. A timepiece comprising the semiconductor device as defined in claim 21, wherein a timepiece reference signal is shaped from the oscillation output of said oscillation circuit.

28. The oscillation circuit as defined in claim 16, wherein the potential difference said first potential and said second potential is greater than the absolute value of an oscillation-stopped voltage of said signal inversion amplifier.

29. The oscillation circuit as defined in claim 16, wherein a short-circuit current flowing through said signal inversion amplifier has a value a within range that satisfies a first condition such that the short-circuit current is greater than the ON-state current of a transistor configuring said signal inversion amplifier, whereby said back gate voltage is selected; and wherein a potential between the first potential and the second potential is at a minimum voltage within the range for satisfying said first condition.

30. Electronic equipment comprising the semiconductor device as defined in claim 18, wherein an operating reference signal is shaped from an oscillation output of said oscillation circuit.

31. A timepiece comprising the semiconductor device as defined in claim 18, wherein a timepiece reference signal is shaped from the oscillation output of said oscillation circuit.

32. A semiconductor device comprising the electronic circuit as defined in claim 17.

33. Electronic equipment comprising the electronic circuit as defined in claim 17, wherein an operating reference signal is shaped from an oscillation output of said oscillation circuit.

34. A timepiece comprising the electronic circuit as defined in claim 17, wherein a timepiece reference signal is shaped from the oscillation output of said oscillation circuit.

35. Electronic equipment comprising the semiconductor device as defined in claim 32, wherein an operating reference signal is shaped from an oscillation output of said oscillation circuit.

36. A timepiece comprising the semiconductor device as defined in claim 32, wherein a timepiece reference signal is shaped from the oscillation output of said oscillation circuit.

* * * * *